US012739091B2

(12) United States Patent
Uehara

(10) Patent No.: US 12,739,091 B2
(45) Date of Patent: Sep. 15, 2026

(54) PHASE INTERPOLATION CIRCUIT, CIRCUIT DEVICE, AND OSCILLATOR

(71) Applicant: SEIKO EPSON CORPORATION, Tokyo (JP)

(72) Inventor: Jun Uehara, Fujimi (JP)

(73) Assignee: SEIKO EPSON CORPORATION (JP)

( * ) Notice: Subject to any disclaimer, the term of this patent is extended or adjusted under 35 U.S.C. 154(b) by 3 days.

(21) Appl. No.: 19/082,342

(22) Filed: Mar. 18, 2025

(65) Prior Publication Data

US 2025/0300802 A1 Sep. 25, 2025

(30) Foreign Application Priority Data

Mar. 19, 2024 (JP) ................................ 2024-043111

(51) Int. Cl.
*H04L 7/00* (2006.01)
*H03K 5/13* (2014.01)

(52) U.S. Cl.
CPC ............ *H04L 7/0025* (2013.01); *H03K 5/13* (2013.01)

(58) Field of Classification Search
CPC ........ H04L 7/0025; H03K 5/13; H03K 5/135; H03L 7/18; H03L 7/1077
See application file for complete search history.

(56) References Cited

U.S. PATENT DOCUMENTS 10,855,294 B2 12/2020 Haroun et al.
2003/0123594 A1* 7/2003 Glenn .................. H03L 7/0814 375/373
2013/0069701 A1* 3/2013 Huang .................. H03K 5/131 327/175

FOREIGN PATENT DOCUMENTS

JP 2022-163176 A 10/2022

OTHER PUBLICATIONS

Katsuragi, M. et al., "Consideration for Accurate Phase Interpolator", Department of Physical Electronics, Tokyo Institute of Technology, Published Sep. 11, 2015, 6 Pages.

* cited by examiner

*Primary Examiner* — Vineeta S Panwalkar
(74) *Attorney, Agent, or Firm* — Harness, Dickey & Pierce, P.L.C.

(57) ABSTRACT

A phase interpolation circuit configured to generate an interpolation clock signal obtained by performing phase interpolation between clock signals includes a current source circuit that is disposed between a power supply node and a node and supplies the node with a current that flows when one of the clock signals is active and a current that flows when the other of the clock signals is active, a discharging transistor that is disposed between the node and the power supply node and is turned on when the clock signals are inactive, a current control circuit configured to set a current ratio between the currents based on a phase interpolation signal that instructs a ratio of phase interpolation between the clock signals, and an output circuit configured to output an interpolation clock signal based on a signal at the node.

12 Claims, 19 Drawing Sheets

| PI<3:1> | SCK3 | SCK2 | SCK1 | SCK0 | CURRENT RATIO [I1:I2] |
|---|---|---|---|---|---|
| | TS3(4I) | TS2(2I) | TS1(1I) | TS0(1I) | |
| 7(1, 1, 1) | CK2B | CK2B | CK2B | CK1B | 1:7 |
| 6(1, 1, 0) | CK2B | CK2B | CK1B | CK1B | 2:6 |
| 5(1, 0, 1) | CK2B | CK1B | CK2B | CK1B | 3:5 |
| 4(1, 0, 0) | CK2B | CK1B | CK1B | CK1B | 4:4 |
| 3(0, 1, 1) | CK1B | CK2B | CK2B | CK1B | 5:3 |
| 2(0, 1, 0) | CK1B | CK2B | CK1B | CK1B | 6:2 |
| 1(0, 0, 1) | CK1B | CK1B | CK2B | CK1B | 7:1 |
| 0(0, 0, 0) | CK1B | CK1B | CK1B | CK1B | 8:0 |

FIG. 8

1I(k=1, dummy k=3)
TS0
TS1
DM0
DM1

2I(k=2, dummy k=2)
TS2
DM2

4I(k=4)
TS3

73
CONTROL VOLTAGE GENERATION CIRCUIT
72
74
75
76
RFCK
PHASE COMPARISON CIRCUIT
CHARGE PUMP CIRCUIT
QCP
LOOP FILTER CIRCUIT
VC
VOLTAGE-CONTROLLED OSCILLATION CIRCUIT
CK
80
FREQUENCY DIVIDER CIRCUIT
88
FREQUENCY DIVIDER
SDIV
90
DELTA-SIGMA MODULATION CIRCUIT
FBCK
92
OPERATIONAL CIRCUIT
94
INTEGRATOR
20
30
PHASE INTERPOLATION CIRCUIT

40
CURRENT SOURCE CIRCUIT
VDD
ND
SCK0
SCK1
SCK2
SCK3
SCK4
DM0
DM1
DM2
DM3
TS0
TS1
TS2
TS3
TS4
k=7
k=1
K=2
K=6
K=4
k=8
I1
2I
4I
8I
PICK
IV
CP
OUTPUT CIRCUIT
60
SQ
N1
TD1
TD2
NG
GND
SDS

FIG. 20

| PI<4:1> | SCK4 | SCK3 | SCK2 | SCK1 | SCK0 | CURRENT RATIO [I1:I2] |
|---|---|---|---|---|---|---|
| | TS4(8I) | TS3(4I) | TS2(2I) | TS1(1I) | TS0(1I) | |
| 15(1, 1, 1, 1) | CK2B | CK2B | CK2B | CK2B | CK1B | 1:15 |
| 14(1, 1, 1, 0) | CK2B | CK2B | CK2B | CK1B | CK1B | 2:14 |
| 13(1, 1, 0, 1) | CK2B | CK2B | CK1B | CK2B | CK1B | 3:13 |
| 12(1, 1, 0, 0) | CK2B | CK2B | CK1B | CK1B | CK1B | 4:12 |
| 11(1, 0, 1, 1) | CK2B | CK1B | CK2B | CK2B | CK1B | 5:11 |
| 10(1, 0, 1, 0) | CK2B | CK1B | CK2B | CK1B | CK1B | 6:10 |
| 9(1, 0, 0, 1) | CK2B | CK1B | CK1B | CK2B | CK1B | 7:9 |
| 8(1, 0, 0, 0) | CK2B | CK1B | CK1B | CK1B | CK1B | 8:8 |
| 7(0, 1, 1, 1) | CK1B | CK2B | CK2B | CK2B | CK1B | 9:7 |
| 6(0, 1, 1, 0) | CK1B | CK2B | CK2B | CK1B | CK1B | 10:6 |
| 5(0, 1, 0, 1) | CK1B | CK2B | CK1B | CK2B | CK1B | 11:5 |
| 4(0, 1, 0, 0) | CK1B | CK2B | CK1B | CK1B | CK1B | 12:4 |
| 3(0, 0, 1, 1) | CK1B | CK1B | CK2B | CK2B | CK1B | 13:3 |
| 2(0, 0, 1, 0) | CK1B | CK1B | CK2B | CK1B | CK1B | 14:2 |
| 1(0, 0, 0, 1) | CK1B | CK1B | CK1B | CK2B | CK1B | 15:1 |
| 0(0, 0, 0, 0) | CK1B | CK1B | CK1B | CK1B | CK1B | 16:0 |

PHASE INTERPOLATION CIRCUIT, CIRCUIT DEVICE, AND OSCILLATOR

The present application is based on, and claims priority from JP Application Serial Number 2024-043111, filed Mar. 19, 2024, the disclosure of which is hereby incorporated by reference herein in its entirety.

BACKGROUND

1. Technical Field

The present disclosure relates to a phase interpolation circuit, a circuit device, an oscillator, and so on.

2. Related Art

In fractional-N PLL circuits or the like, it is desirable to provide a phase interpolation circuit that performs phase interpolation of a frequency-divided clock signal in order to achieve reduction in phase noise and so on. A phase interpolation circuit which makes pipeline coupling of phase-dividing units to generate a signal with an intermediate phase with respect to an input signal is disclosed in, for example, Makihiko Katsuragi, Tn Aravind, Kenichi Okada, Akira Matsuzawa "Consideration for Accurate Phase Interpolator" The Institute of Electronics, Information, and Communication Engineers Society Conference, September 2015.

Makihiko Katsuragi, Tn Aravind, Kenichi Okada, Akira Matsuzawa "Consideration for Accurate Phase Interpolator" The Institute of Electronics, Information, and Communication Engineers Society Conference, September 2015 is an example of the related art.

In the case of the phase interpolation circuit disclosed in Makihiko Katsuragi, Tn Aravind, Kenichi Okada, Akira Matsuzawa "Consideration for Accurate Phase Interpolator" The Institute of Electronics, Information, and Communication Engineers Society Conference, September 2015, it is necessary to couple n stages of phase-dividing units in order to divide the phase by $2^n$. However, there arises a problem that the linearity of the phase thus divided is deteriorated due to a variation in threshold voltage of transistors in the respective phase-dividing units coupled in multiple stages as described above.

SUMMARY

An aspect of the present disclosure relates to a phase interpolation circuit configured to generate an interpolation clock signal obtained by performing phase interpolation between a first clock signal and a second clock signal different in phase from the first clock signal, the phase interpolation circuit including a current source circuit that is disposed between a first power supply node and a first node, and supplies the first node with a first current that flows when the first clock signal becomes active and a second current that flows when the second clock signal becomes active, a discharging transistor that is disposed between the first node and a second power supply node, and that is turned ON when the first clock signal and the second clock signal become inactive, a current control circuit configured to set a current ratio between the first current and the second current based on a phase interpolation signal that instructs a ratio of phase interpolation between the first clock signal and the second clock signal, and an output circuit configured to output the interpolation clock signal based on a signal at the first node.

Further, another aspect of the present disclosure relates to a circuit device including the phase interpolation circuit described above, a frequency divider circuit configured to output the interpolation clock signal from the phase interpolation circuit as a feedback clock signal, a phase comparison circuit configured to perform phase comparison between a reference clock signal and the feedback clock signal, a control voltage generation circuit configured to generate a control voltage based on a phase comparison result of the phase comparison circuit, and a voltage-controlled oscillation circuit configured to generate a clock signal with a frequency corresponding to the control voltage, in which the phase interpolation circuit generates the interpolation clock signal from the first clock signal and the second clock signal based on the clock signal.

Further, another aspect of the present disclosure relates to an oscillator including the circuit device described above, and a resonator configured to generate the reference clock signal.

BRIEF DESCRIPTION OF THE DRAWINGS

FIG. 1 is a configuration example of a phase interpolation circuit according to an embodiment.

FIG. 4 is a diagram showing a configuration example of a current source circuit and an output circuit.

FIG. 6 is a diagram showing a truth table illustrating the operation of the present embodiment.

FIG. 8 is a diagram showing a layout arrangement example of current source transistors and dummy transistors.

FIG. 20 is a diagram showing a truth table illustrating an operation of the phase interpolation circuit.

DESCRIPTION OF EMBODIMENTS

Figure 2:
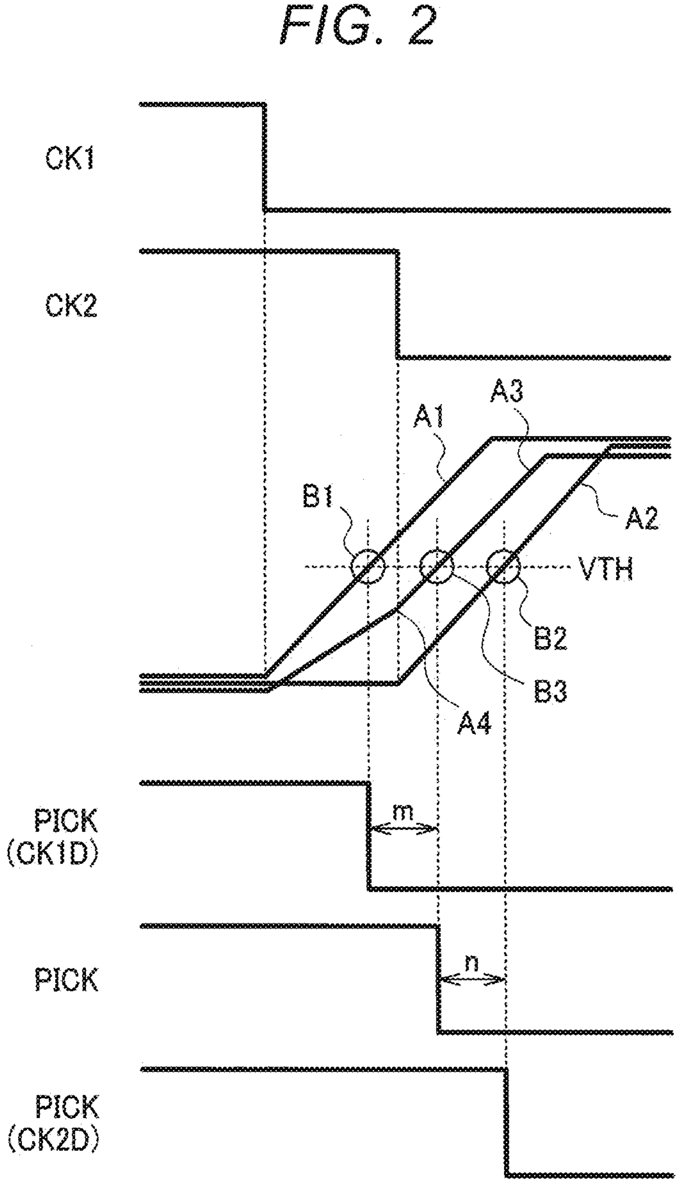
FIG. 2 is a signal waveform diagram illustrating an operation of the present embodiment.

An embodiment will hereinafter be described. Note that the embodiment hereinafter described does not unduly limit the scope of the appended claims. Further, all the configurations described in the embodiment are not necessarily essential elements.

1. Phase Interpolation Circuit

Figure 1:
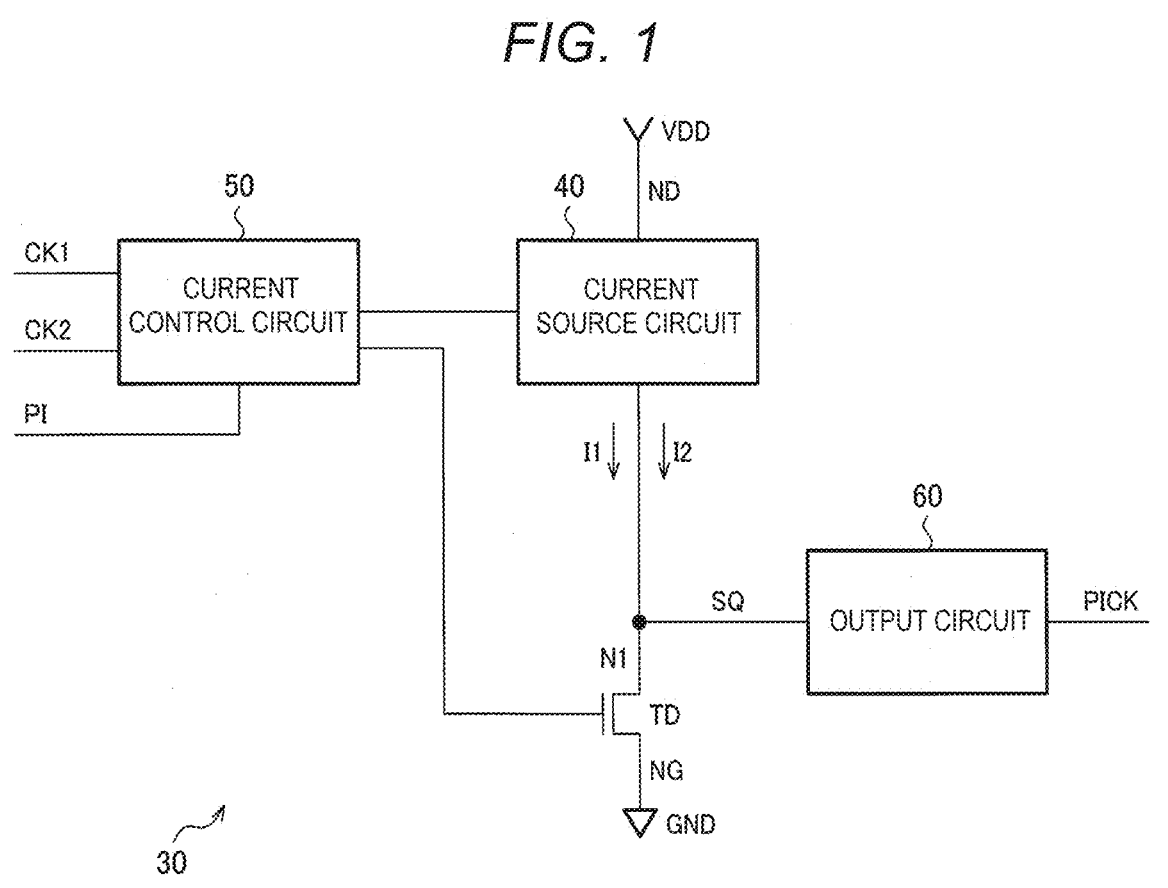

FIG. 1 shows a configuration example of a phase interpolation circuit 30 in the present embodiment. The phase interpolation circuit 30 generates an interpolation clock signal PICK obtained by performing phase interpolation between the clock signal CK1 and the clock signal CK2. The clock signal CK1 corresponds to a first clock signal. The clock signal CK2 corresponds to a second clock signal, and is a clock signal different in phase from the clock signal CK1. For example, the phase interpolation circuit 30 generates an intermediate phase signal having a phase between the phase of a signal corresponding to the clock signal CK1 and the phase of a signal corresponding to the clock signal CK2 as the interpolation clock signal PICK. The signal corresponding to the clock signal CK1 is, for example, a delay signal of the clock signal CK1, and is a signal obtained when a signal delay occurs in the clock signal CK1 due to, for example, a circuit delay. Similarly, the signal corresponding to the clock signal CK2 is, for example, a delay signal of the clock signal CK2, and is a signal obtained when a signal delay occurs in the clock signal CK2 due to, for example, the circuit delay. The delay signals of the clock signals CK1, CK2 are signals obtained by delaying edges which are falling edges or rising edges of the clock signals CK1, CK2. Delay time of the edge in the delay signal of the clock signal CK1 and delay time of the edge in the delay signal of the clock signal CK2 are, for example, equivalent to each other. For example, the clock signal CK1 and the clock signal CK2 are subjected to the signal delay by respective circuits substantially the same in configuration as each other to turn to the signal corresponding to the clock signal CK1 and the signal corresponding to the clock signal CK2, respectively.

The phase interpolation circuit 30 includes a current source circuit 40, a discharging transistor TD, a current control circuit 50, and an output circuit 60. Note that the phase interpolation circuit 30 is not limited to the configuration in FIG. 1, and there can be made a variety of modifications such as omission of some of these constituents, addition of constituents, and replacement of some of the constituents with other constituents.

The current source circuit 40 is disposed between a power supply node ND and a node N1. The power supply node ND corresponds to a first power supply node, and is, for example, a node of VDD as a high-potential side power supply. Note that the first power supply node may be a node of a low-potential side power supply node. The node N1 corresponds to a first node, and is, for example, a node between the current source circuit 40 and the discharging transistor TD. The current source circuit 40 is a circuit to be a current source of the phase interpolation circuit 30, and supplies a current I1 and a current I2 to the node N1. The current I1 corresponds to a first current, and is a current which flows when, for example, the clock signal CK1 becomes active. The current I2 corresponds to a second current, and is a current which flows when, for example, the clock signal CK2 becomes active. When the clock signals CK1, CK2 become active corresponds to when the clock signals CK1, CK2 are changed from, for example, an inactive level to an active level. The active level is one of a low level and a high level, and the inactive level is the other of the low level and the high level. For example, when the clock signal CK1 is activated, the current source circuit 40 supplies the current I1 to the node N1 behind the timing when the clock signal CK1 is activated as much as the delay time of the circuit. Further, when the clock signal CK2 is activated, the current source circuit 40 supplies the current I2 to the node N1 behind the timing when the clock signal CK2 is activated as much as the delay time of the circuit.

The discharging transistor TD is disposed between the node N1, which is the first node, and a power supply node NG. The discharging transistor TD is, for example, an N-type transistor, and is, for example, an N-type MOS transistor. The power supply node NG corresponds to a second power supply node, and is, for example, a node of GND as a low-potential side power supply. The voltage of GND is a ground voltage, and GND may also be called VSS. Note that the second power supply node may be a node of a high-potential side power supply. In this case, the discharging transistor is, for example, a P-type transistor. Further, the discharging transistor TD is turned ON when the clock signal CK1 and the clock signal CK2 are inactivated. That is, when the clock signal CK1 becomes active, the current I1 is supplied from the current source circuit 40 to the node N1, and when the clock signal CK2 becomes active, the current I2 is supplied from the current source circuit 40 to the node N1. Then, when the clock signal CK1 and the clock signal CK2 are both inactivated, the discharging transistor TD is turned ON, and for example, the charge of the node N1 is discharged toward the power supply node NG. Note that the timing at which the discharging transistor TD is turned ON is, for example, a timing delayed as much as the delay time of the circuit after the clock signal CK1 and the clock signal CK2 become inactive.

The current control circuit 50 sets a current ratio between the current I1 as the first current and the current I2 as the second current based on a phase interpolation signal PI between the clock signal CK1 and the clock signal CK2. The phase interpolation signal PI is a signal which instructs a ratio of phase interpolation between the clock signal CK1 and the clock signal CK2 (a signal which instructs an interpolation phase in the phase interpolation), and is a signal in, for example, p bits (p is an integer no smaller than 2). For example, the phase interpolation signal PI is a signal instructing an intermediate phase which is an interpolation phase between the phase of the signal corresponding to the clock signal CK1 and the phase of the signal corresponding to the clock signal CK2, and is a signal instructing the ratio of the phase interpolation. The phase interpolation signal PI is input from a control circuit (not shown) to the current control circuit 50. The current control circuit 50 outputs a control signal based on the phase interpolation signal PI to the current source circuit 40 to thereby set a current ratio between the current I1 and the current I2. For example, when a phase close to that of the signal corresponding to the clock signal CK1 is instructed by the phase interpolation signal PI as the intermediate phase as the interpolation phase, the current control circuit 50 outputs the control signal for setting the current ratio at which the current I1 becomes larger than the current I2. Further, when a phase close to that of the signal corresponding to the clock signal CK2 is instructed by the phase interpolation signal PI as the intermediate phase as the interpolation phase, the current control circuit 50 outputs the control signal for setting the current ratio at which the current I2 becomes larger than the current I1. The current control circuit 50 can be realized by, for example, a logic circuit and so on.

The output circuit 60 outputs the interpolation clock signal PICK based on a signal SQ at the node N1. For example, the output circuit 60 outputs the interpolation clock signal PICK that takes a first voltage level when the voltage of the signal SQ is lower than a given threshold voltage and takes a second voltage level when the voltage of the signal SQ is higher than a given threshold voltage. The first voltage level is one of the high level and the low level, and the second voltage level is the other of the high level and the low level. For example, the output circuit 60 may include a buffer circuit for buffering the signal SQ. The buffer circuit may be a circuit that inverts the signal level of the signal SQ or a circuit that does not invert the signal level.

FIG. 2 is a signal waveform diagram illustrating an operation of the phase interpolation circuit 30. The waveform of A1 in FIG. 2 corresponds to the waveform of the signal SQ at the node N1 when only the clock signal CK1 becomes active. For example, when the clock signal CK1 becomes active, the current I1 from the current source circuit 40 is supplied to the node N1 to perform charging, and thus, the voltage of the signal SQ changes as indicated by A1. The waveform of A2 corresponds to the waveform of the signal SQ when only the clock signal CK2 becomes active. For example, when the clock signal CK2 becomes active, the current I2 from the current source circuit 40 is supplied to the node N1 to perform charging, and thus, the voltage of the signal SQ changes as indicated by A2.

Further, the waveform of A3 in FIG. 2 corresponds to the waveform of the signal SQ when the clock signal CK2 becomes active after the clock signal CK1 becomes active. That is, until the timing of A4 in FIG. 2, the node N1 is charged only by the current I1 from the current source circuit 40, but on and after the timing of A4, the node N1 is charged by the current I1 and the current I2 from the current source circuit 40. Therefore, it results in that the voltage of the signal SQ changes at a higher change rate compared to that of the waveform of A1 on and after the timing of A4 as represented by the waveform of A3.

Then, assuming that the waveform of the signal SQ is supposedly the waveform of A1, the interpolation clock signal PICK changes from the high level to the low level at the timing indicated by B1 at which the voltage of the signal SQ exceeds a threshold voltage VTH in the output circuit 60. The threshold voltage VTH is a threshold voltage of the buffer circuit provided to the output circuit 60. Further, assuming that the waveform of the signal SQ is supposedly the waveform of A2, the interpolation clock signal PICK changes from the high level to the low level at the timing indicated by B2 at which the voltage of the signal SQ exceeds the threshold voltage VTH. Further, when the waveform of the signal SQ is the waveform of A3, the interpolation clock signal PICK changes from the high level to the low level at the timing indicated by B3 at which the voltage of the signal SQ exceeds the threshold voltage VTH.

Thereafter, when both the clock signal CK1 and the clock signal CK2 change to the high level which is the inactive level, the electric charge charged at the node N1 is discharged by the discharging transistor TD. Accordingly, the signal SQ changes to the low level, and the interpolation clock signal PICK changes from the low level to the high level.

As is obvious from FIG. 2, the phase of the interpolation clock signal PICK can be set with the setting of the current I1 flowing when the clock signal CK1 is activated and the current I2 flowing when the clock signal CK2 is activated.

For example, in FIG. 2, a signal CK1D is a signal corresponding to the clock signal CK1 and corresponds to a delayed clock signal obtained by delaying the edge of the clock signal CK1. A signal CK2D is a signal corresponding to the clock signal CK2 and corresponds to a delayed clock signal obtained by delaying the edge of the clock signal CK2. For example, the signals CK1D, CK2D correspond to signals obtained by applying the signal delay caused by a parasitic capacitance in the node N1, a capacitor provided to the output circuit 60, and so on to the clock signals CK1, CK2, respectively. Further, the interpolation clock signal PICK can be said to be a signal with an intermediate phase between the phase of the signal CK1D and the phase of the signal CK2D. For example, the interpolation clock signal PICK is a signal obtained by performing the phase interpolation between the phase of the signal CK1D as a signal corresponding to the clock signal CK1 and the phase of the signal CK2D as a signal corresponding to the clock signal CK2 at a ratio of m:n. Here, m and n are, for example, integers no smaller than 0. For example, the phase interpolation circuit 30 sets the current ratio between the current I1 and the current I2 to n:m to thereby generate the interpolation clock signal PICK obtained by performing the phase interpolation between the phases of the signal CK1D and the signal CK2D at the ratio of m:n. For example, the signal CK1D corresponds to a signal when the current I2 is 0, and corresponds to a signal when the current ratio between I1 and I2 is set to, for example, q:0. The character q represents a constant corresponding to the sum of m and n. The signal CK2D is a signal when the current I1 is 0, and corresponds to a signal when the current ratio between I1 and I2 is set to, for example, 0:q.

For example, in the present embodiment, when the phase interpolation signal PI that generates the interpolation clock signal PICK having a phase closer to the phase of the signal corresponding to the clock signal CK1 compared to the phase of the signal corresponding to the clock signal CK2 is input to the current control circuit 50, the current control circuit 50 sets the current ratio of making the current I1 higher compared to the current I2.

Figure 3:
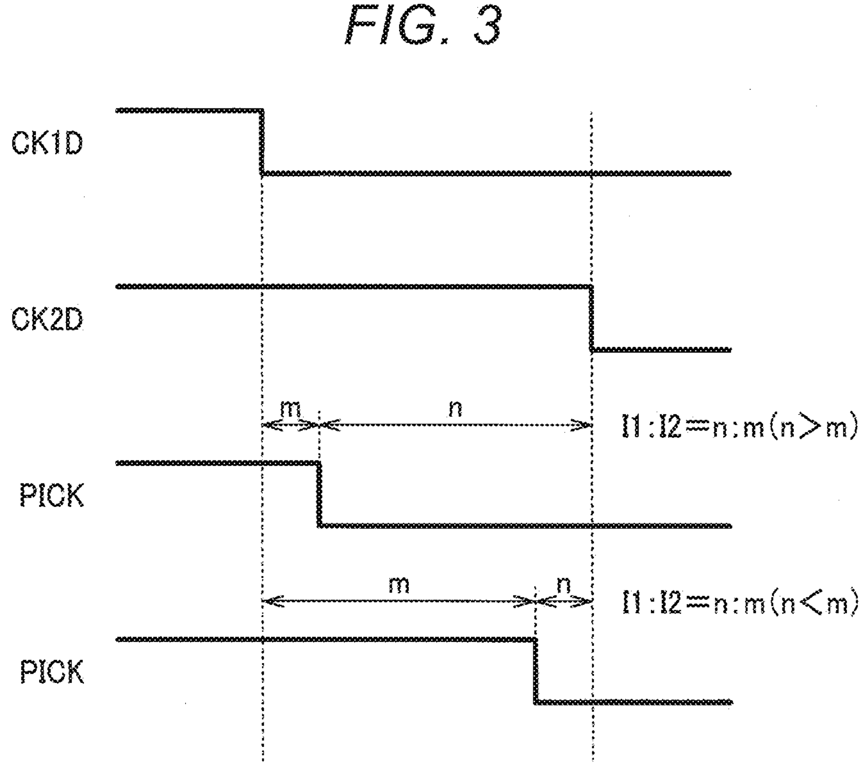
FIG. 3 is a signal waveform diagram illustrating an operation of the present embodiment.

For example, in FIG. 3, it is assumed that the phase interpolation signal PI that generates the interpolation clock signal PICK having a phase closer to the phase of the signal CK1D corresponding to the clock signal CK1 compared to the phase of the signal CK2D corresponding to the clock signal CK2 is input. In this case, the current control circuit 50 sets n:m, which is the current ratio between the current I1 and the current I2, to n>m so as to make the current I1 higher. By setting the current ratio which makes the current I1 higher in this way, it is possible to make the phase of the interpolation clock signal PICK closer to the phase of the signal CK1D corresponding to the clock signal CK1 as described with reference to FIG. 2. Accordingly, it becomes possible to variably set the phase of the interpolation clock signal PICK with the setting of the current ratio between the current I1 and the current I2.

Further, in FIG. 3, it is assumed that the phase interpolation signal PI which generates the interpolation clock signal PICK having a phase closer to the phase of the signal CK2D corresponding to the clock signal CK2 compared to the phase of the signal CK1D corresponding to the clock signal CK1 is input. In this case, the current control circuit 50 sets n:m which is the current ratio between the current I1 and the current I2 to n<m so as to make the current I2 higher. By setting the current ratio which makes the current I2 higher in this way, it is possible to make the phase of the interpolation clock signal PICK closer to the phase of the signal CK2D corresponding to the clock signal CK2 as described with reference to FIG. 2. Accordingly, it becomes possible to variably set the phase of the interpolation clock signal PICK with the setting of the current ratio between the current I1 and the current I2.

That is, in FIG. 3, when the phase interpolation signal PI that performs the phase interpolation between the signal CK1D corresponding to the clock signal CK1 and the signal CK2D corresponding to the clock signal CK2 at m:n is input, the current control circuit 50 sets the current ratio between the current I1 and the current I2 to n:m. In this way, by the current control circuit 50 setting the current ratio between I1 and I2 to n:m, it becomes possible to generate the interpolation clock signal PICK obtained by performing the phase interpolation between the signal CK1D corresponding to the clock signal CK1 and the signal CK2D corresponding to the clock signal CK2 at m:n.

For example, it is assumed that the phase interpolation signal PI that brings the phase of the interpolation clock signal PICK closer to the phase of the signal CK1D such as the phase interpolation signal PI in which m=1 and n=7 are set is input. In this case, the current control circuit 50 sets the current ratio between the current I1 and the current I2 to n:m=7:1. By setting the current ratio which makes the current I1 higher in this way, the interpolation clock signal PICK having a phase closer to the phase of the signal CK1D is generated. Further, it is assumed that the phase interpolation signal PI that brings the phase of the interpolation clock signal PICK closer to the phase of the signal CK2D such as the phase interpolation signal PI in which m=7 and n=1 are set is input. In this case, the current control circuit 50 sets the current ratio between the current I1 and the current I2 to n:m=1:7. By setting the current ratio which makes the current I2 higher in this way, the interpolation clock signal PICK having a phase closer to the phase of the signal CK2D is generated. Note that m and n in m:n which is a division ratio in the phase interpolation, and m and n in n:m which is the current ratio are not required to completely coincide with each other, and are only required to substantively coincide with each other within a range in which variation and so on are considered.

Figure 4:
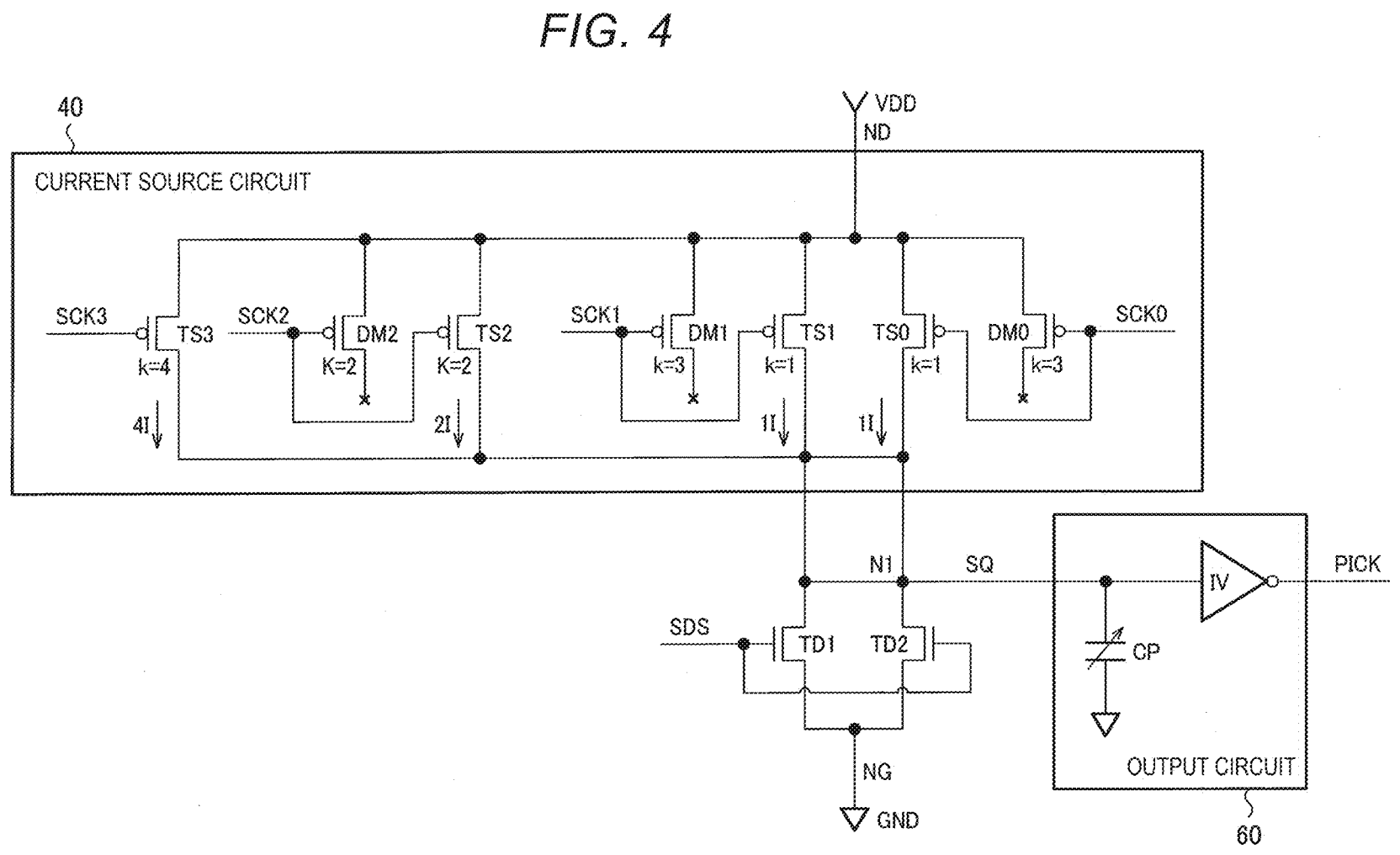

FIG. 4 shows a configuration example of the current source circuit 40 and the output circuit 60. Note that the current source circuit 40 and the output circuit 60 are not limited to the configurations shown in FIG. 5, and various modifications such as omission of some of these constituents, addition of other constituents, or replacement of some of the constituents with other constituents can be made.

As shown in FIG. 4, the current source circuit 40 includes current source transistors TS0, TS1, TS2, and TS3 disposed in parallel to each other between the power supply node ND and the node N1. In FIG. 4, the current source transistors TS0, TS1, TS2, and TS3 are, for example, P-type transistors, the drains are coupled to the power supply node ND at the high potential side, and the sources are coupled to the node N1. Note that the current source transistors may be N-type transistors, and in this case, the first power supply node is the node of the low potential side power supply. Further, the selection clock signals SCK0, SCK1, SCK2, and SCK3 are input to the gates of the current source transistors TS0, TS1, TS2, and TS3 to turn ON and OFF the current source transistors TS0, TS1, TS2, and TS3, respectively. The selection clock signals SCK0, SCK1, SCK2, and SCK3 are clock signals selected from the clock signal CK1 or the clock signal CK2 based on the phase interpolation signal PI, and is generated and then output by, for example, the current control circuit 50. Note that the clock signal of the selection source which is selected as the selection clock signal may be the clock signals CK1, CK2 themselves, or may be signal obtained by buffering the clock signals CK1, CK2 with buffer circuits. Further, the selection clock signal is selected from the clock signal CK1 or the clock signal CK2 in accordance with the logic level of each bit of, for example, the p-bit phase interpolation signal PI.

Then, the selection clock signals SCK0, SCK1 are input to the gates of the current source transistors TS0, TS1 in FIG. 4, and the current source transistors TS0, TS1 each supply, for example, a current of 1I to the node N1 when the selection clock signals SCK0, SCK1 become active. Further, the selection clock signal SCK2 is input to the gate of the current source transistor TS2, and the current source transistor TS2 supplies, for example, a current of 2I to the node N1 when the selection clock signal SCK2 becomes active. Further, the selection clock signal SCK3 is input to the gate of the current source transistor TS3, and the current source transistor TS3 supplies, for example, a current of 4I to the node N1 when the selection clock signal SCK3 becomes active. In FIG. 4, k corresponds to the number of unit transistors constituting each current source transistor, for example. The current source transistors TS0, TS1 where k=1 each flow a current of 1I with, for example, one unit transistor. Further, the current source transistor TS2 where k=2 supplies a current of 2I with, for example, two unit transistors, and the current source transistor TS3 where k=4 supplies a current of 4I with, for example, four unit transistors. As described above, the currents flowing through the current source transistors TS0, TS1, TS2, and TS3 are set to, for example, current values represented by powers of 2.

Further, in FIG. 4, dummy transistors DM0, DM1, and DM2 are also provided in the current source circuit 40. The dummy transistor DM0 is disposed in parallel to the current source transistor TS0, and the selection clock signal SCK0 which is input to the gate of the current source transistor TS0 is input to the gate of the dummy transistor DM0. Further, while the drain of the current source transistor TS0 is coupled to the node N1, the drain of the dummy transistor DM0 is not coupled to the node N1. Note that the source of the dummy transistor DM0 is coupled to the power supply node ND. Since the drain of the dummy transistor DM0 is not coupled to the node N1 as described above, the dummy transistor DM0 becomes a dummy transistor which fails to function as a current source transistor.

Further, the dummy transistor DM1 is disposed in parallel to the current source transistor TS1, and the selection clock signal SCK1 which is input to the gate of the current source transistor TS1 is input to the gate of the dummy transistor DM1. Further, the drain of the dummy transistor DM1 is not coupled to the node N1. Further, the dummy transistor DM2 is disposed in parallel to the current source transistor TS2, and the selection clock signal SCK2 which is input to the gate of the current source transistor TS1 is input to the gate of the dummy transistor DM2. Further, the drain of the dummy transistor DM2 is not coupled to the node N1. Note that the sources of the dummy transistors DM1, DM2 are coupled to the power supply node ND.

By providing such dummy transistors DM0, DM1, and DM2, the gate capacitances, which are the parasitic capacitances added to the selection clock signals SCK0, SCK1, SCK2, and SCK3 input to the gates of the current source transistors TS0, TS1, TS2, and TS3, can be made equivalent to each other. Since the gate capacitances added to the selection clock signals SCK0, SCK1, SCK2, and SCK3 become the gate capacitances equivalent to each other as described above, it is possible to make the selection clock signals SCK0, SCK1, SCK2, and SCK3 equivalent in rounding of the signal waveform and so on to each other. This makes it possible to improve the linearity and so on of the divisional phases in the interpolation clock signal PICK.

For example, k=1 is set in the current source transistors TS0, TS1, and thus, the current source transistors TS0, TS1 are each configured with one unit transistor, and k=3 is set in the dummy transistors DM0, DM1, and thus, the dummy transistors DM0, DM1 are each configured with three unit transistors. Accordingly, the gate capacitance added to the selection clock signal SCK0 input to the gate of the current source transistor TS0 and the gate of the dummy transistor DM0 becomes the gate capacitance of the four unit transistors. Further, the gate capacitance added to the selection clock signal SCK1 input to the gate of the current source transistor TS1 and the gate of the dummy transistor DM1 also becomes the gate capacitance of the four unit transistors similarly to the case of the selection clock signal SCK0.

Further, k=2 is set in the current source transistor TS2, and thus, the current source transistor TS2 is configured with two unit transistors, and k=2 is set in the dummy transistor DM2, and thus, the dummy transistor DM2 is configured with two unit transistors. Therefore, the gate capacitance added to the selection clock signal SCK2 input to the gate of the current source transistor TS2 and the gate of the dummy transistor DM2 becomes the gate capacitance of the four unit transistors similarly to the cases of the selection clock signals SCK0, SCK1. Further, k=4 is set in the current source transistor TS3, and thus, the current source transistor TS3 is configured with the four unit transistors. Therefore, the gate capacitance added to the selection clock signal SCK3 input to the gate of the current source transistor TS3 becomes the gate capacitance of the four unit transistors similarly to the cases of the selection clock signals SCK0, SCK1, and SCK2. As described above, in FIG. 4, by providing the dummy transistors DM0, DM1, and DM2, the gate capacitances added to the selection clock signals SCK0, SCK1, SCK2, and SCK3 are set to the gate capacitances equivalent to each other. Thus, it becomes possible to make the selection clock signals SCK0, SCK1, SCK2, and SCK3 equivalent in rounding of the waveform to each other to improve the linearity in the phase interpolation.

Further, in FIG. 4, transistors TD1, TD2 are provided as the discharging transistor TD in FIG. 1. The transistors TD1, TD2 are disposed in parallel to each other between the node N1 and the power supply node NG, and a control signal SDS for discharge is input to the gates of the transistors TD1, TD2. In FIG. 4, the transistors TD1, TD2 for discharge are N-type transistors. However, a modified implementation of using P-type transistors as the transistors TD1, TD2 for discharge is also possible.

The control signal SDS input to the gates of the transistors TD1, TD2 for discharge is generated and output by, for example, the current control circuit 50. For example, the control signal SDS is a signal which is activated when the clock signal CK1 and the clock signal CK2 are inactive. Thus, when the clock signal CK1 and the clock signal CK2 are both inactive, the transistors TD1, TD2 for discharge are turned ON, and the electric charges charged to the node N1 by the currents I1, I2 are discharged to the power supply node NG via the transistors TD1, TD2 for discharge. This makes it possible to initialize the voltage of the signal SQ at the node N1 to the low level.

The output circuit 60 includes a capacitor CP and a buffer circuit IV. One end of the capacitor CP is coupled to the node N1. The signal SQ at the node N1 is input to the buffer circuit IV. Then, the buffer circuit IV outputs an interpolation clock signal PICK based on the signal SQ. The other end of the capacitor CP is coupled to the GND node in FIG. 4, but may be coupled to a node at a predetermined potential other than GND. As the capacitor CP, for example, a MIM (Metal-Insulator-Metal) capacitor can be used. Alternatively, a MOS capacitor, which is a gate capacitance of a MOS transistor, may be used as the capacitor CP. Further, in FIG. 4, a capacitor having a variable capacitance is used as the capacitor CP. For example, by adjusting the capacitance of the capacitor CP, it is possible to perform an adjustment according to, for example, a variation in threshold voltage at the time of manufacturing the transistor. Note that the capacitor CP may be a capacitor having a fixed capacitance. Further, in FIG. 4, an inverter circuit is used as the buffer circuit IV of the output circuit 60. When the capacitor CP and the buffer circuit IV are provided in the output circuit 60 as described above, it becomes possible to charge the capacitance of the capacitor CP at the node N1 by the current I1 flowing when the clock signal CK1 becomes active or the current I2 flowing when the clock signal CK2 becomes active. Then, it becomes possible to input the signal SQ at the node N1 the voltage of which changes due to this charging action to the buffer circuit IV to thereby output the interpolation clock signal PICK. For example, as described with reference to FIG. 2, the voltage level of the interpolation clock signal PICK becomes to change when the voltage of the signal SQ at the node N1 changes to exceed the threshold voltage of the buffer circuit IV. Thus, it becomes possible to generate the interpolation clock signal PICK properly interpolated into the intermediate phase corresponding to the phase interpolation signal PI.

Figure 5:
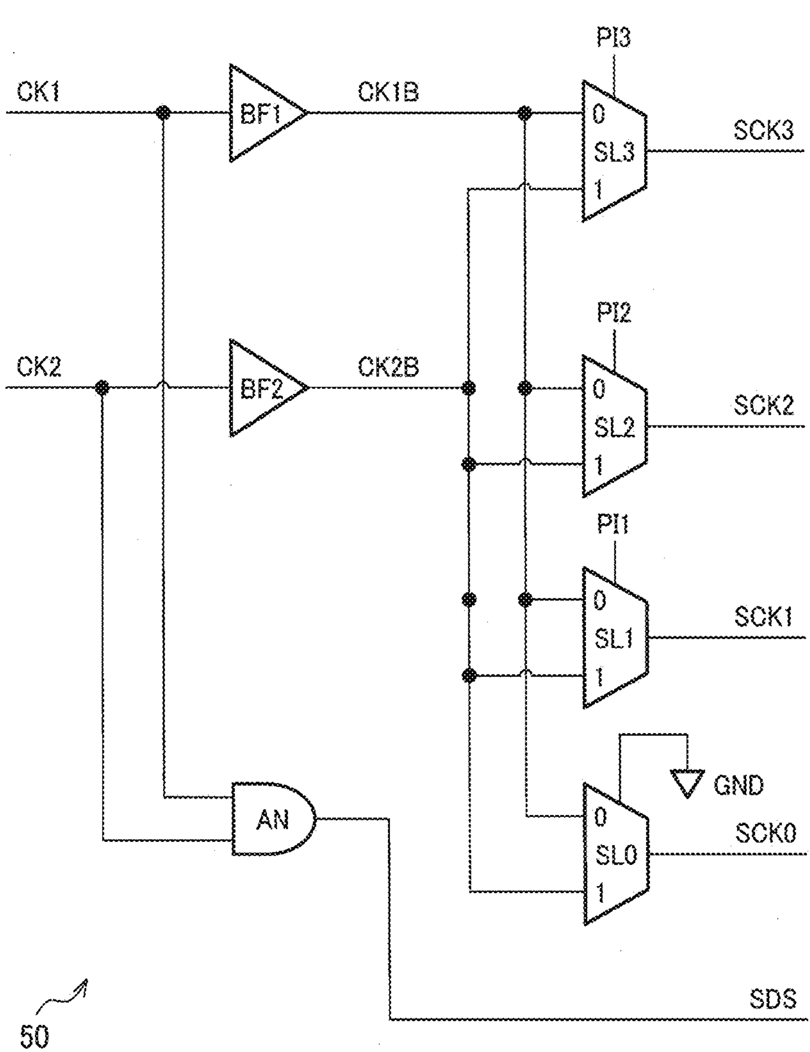
FIG. 5 is a diagram showing a configuration example of a current control circuit.

FIG. 5 shows a configuration example of the current control circuit 50. Note that the current control circuit 50 is not limited to the configuration in FIG. 5, and there can be made a variety of modifications such as omission of some of these constituents, addition of constituents, and replacement of some of the constituents with other constituents.

The current control circuit 50 outputs the plurality of selection clock signals SCK0, SCK1, SCK2, and SCK3 to the gates of the plurality of current source transistors TS0, TS1, TS2, and TS3 of the current source circuit 40, respectively. For example, the current control circuit 50 outputs the selection clock signals SCK0, SCK1, SCK2, and SCK3, which are selected based on the phase interpolation signal PI from the clock signal CK1 or the clock signal CK2, to the current source transistors TS 0, TS1, TS2, and TS3, respectively. This makes it possible to select the clock signal CK1 or the clock signal CK2 as the selection clock signals SCK0, SCK1, SCK2, and SCK3 based on the phase interpolation signal PI and then input the selection clock signals SCK0, SCK1, SCK2, and SCK3 to the gates of the current source transistors TS0, TS1, TS2, and TS3, respectively. Then, when the clock signal CK1 is selected as the selection clock signal, and that selection signal is input to the gate of the current source transistor, that current source transistor turns ON to start supplying the current I1 to the node N1 of the signal SQ when the clock signal CK1 becomes active. Further, when the clock signal CK2 is selected as the selection clock signal, and that selection signal is input to the gate of the current source transistor, that current source transistor turns ON to start supplying the current I2 to the node N1 of the signal SQ when the clock signal CK2 becomes active. This makes it possible to supply the currents I1, I2 to the node N1 of the signal SQ at a current ratio corresponding to the phase interpolation signal PI.

Specifically, as shown in FIG. 5, the current control circuit 50 includes a plurality of selectors SL0, SL1, SL2, and SL3. Further, the plurality of selectors SL0, SL1, SL2, and SL3 outputs the selection clock signals SCK0, SCK1, SCK2, and SCS3 to the gates of the current source transistors TS0, TS1, TS2, and TS3, respectively. In this way, it becomes possible to select the clock signal CK1 or the clock signal CK2 as the selection clock signals in accordance with the phase interpolation signal PI using the selectors SL0, SL1, SL2, and SL3, and then input the selection clock signals to the gates of the current source transistors TS 0, TS1, TS2, and TS3, respectively.

For example, in FIG. 5, the current control circuit 50 includes buffer circuits BF1, BF2 and an AND circuit AN. Then, the clock signal CK1 is buffered by the buffer circuit BF1 and is then input to the selectors SL0, SL1, SL2, and SL3 as a clock signal CK1B. Further, the clock signal CK2 is buffered by the buffer circuit BF2 and is then input to the selectors SL0, SL1, SL2, and SL3 as a clock signal CK2B. The clock signal CK1 and the clock signal CK2 are input to the AND circuit AN, and then the AND circuit AN outputs the control signal SDS for discharge. The control signal SDS is input to the transistors TD1, TD2 for discharge as shown in FIG. 4. For example, when the clock signals CK1, CK2 are both at the high level which is the inactive level, the control signal SDS for discharge becomes high level. This turns ON the transistors TD1, TD2 for discharge to perform the discharge operation of the node N1 of the signal SQ.

Phase interpolation signals PI1, PI2, and PI3 are input to the selectors SL1, SL2, and SL3, respectively, as the phase interpolation signals PI. The phase interpolation signals PI1, PI2, and PI3 are signals corresponding respectively to the first, second, and third bits of the phase interpolation signal PI in 3 bits. Then, when the phase interpolation signals PI1, PI2, and PI3 are "0" as the logic level, the selectors SL1, SL2, and SL3 select the clock signal CK1B. Further, when the phase interpolation signals PI1, PI2, and PI3 are "1" as the logic level, the clock signal CK2B is selected. In this way, it becomes possible for the current control circuit 50 to output the signals selected from the clock signals CK1B, CK2B in accordance with the phase interpolation signals PI1, PI2, and PI3 as the selection clock signals SCK1, SCK2, and SCK3.

Note that in the selector SL0, since the input terminal for the phase interpolation signal PI is set to GND corresponding to "0" as the logic level, the clock signal CK1B is always selected. Further, in the present embodiment, the first clock signal selected based on the phase interpolation signal PI may be the clock signal CK1 itself or the clock signal CK1B obtained by buffering the clock signal CK1 as illustrated in FIG. 5. Further, the second clock signal selected based on the phase interpolation signal PI may be the clock signal CK2 itself or the clock signal CK2B obtained by buffering the clock signal CK2.

FIG. 6 shows a truth table for explaining the operation of the phase interpolation circuit 30. PI<3:1> in FIG. 6 corresponds to PI3, PI2, and PI1 in FIG. 5. For example, PI<3:1>=0, 1, 2, 3 correspond respectively to (PI3, PI2, PI1)=(0, 0, 0), (0, 0, 1), (0, 1, 0), (0, 1, 1). Further, PI<3:1>=4, 5, 6, 7 correspond respectively to (PI3, PI2, PI1)=(1, 0, 0), (1, 0, 1), (1, 1, 0), (1, 1, 1).

For example, as shown in FIG. 4, the selection clock signal SCK3 is input to the gate of the current source transistor TS3, and thus, the current source transistor TS3 supplies a current of 4I to the node N1. Further, in the cases of PI<3:1>=0, 1, 2, 3 in FIG. 6, the third bit PI3, which is the MSB of the phase interpolation signal PI, becomes 0, and therefore, the selector SL3 in FIG. 5 selects the clock signal CK1B as the selection clock signal SCK3. Thus, the current source transistor TS3 having the gate to which the clock signal CK1B is input turns ON to supply the node N1 with the current I1=4I when the clock signal CK1B is active (at the low level).

Further, in the cases of PI<3:1>=4, 5, 6, 7, the third bit PI3 of the phase interpolation signal PI becomes 1, and therefore, the selector SL3 selects the clock signal CK2B as the selection clock signal SCK3. Thus, the current source transistor TS3 having the gate to which the clock signal CK2B is input turns ON to supply the node N1 with the current I2=4I when the clock signal CK2B is active.

Further, as shown in FIG. 4, the selection clock signal SCK2 is input to the gate of the current source transistor TS2, and thus, the current source transistor TS2 supplies a current of 2I to the node N1. Further, in the cases of PI<3:1>=0, 1, 4, 5 in FIG. 6, the second bit PI2 of the phase interpolation signal PI becomes 0, and therefore, the selector SL2 in FIG. 5 selects the clock signal CK1B as the selection clock signal SCK2. Thus, the current source transistor TS2 having the gate to which the clock signal CK1B is input turns ON to supply the node N1 with the current I1=2I when the clock signal CK1B is active.

Further, in the cases of PI<3:1>=2, 3, 6, 7, the second bit PI2 of the phase interpolation signal PI becomes 1, and therefore, the selector SL2 selects the clock signal CK2B as the selection clock signal SCK2. Thus, the current source transistor TS2 having the gate to which the clock signal CK2B is input turns ON to supply the node N1 with the current I2=2I when the clock signal CK2B is active.

Further, the selection clock signal SCK1 is input to the gate of the current source transistor TS1, and thus, the current source transistor TS1 supplies a current of 1I to the node N1. Further, in the cases of PI<3:1>=0, 2, 4, 6 in FIG. 6, the first bit PI1, which is the LSB of the phase interpolation signal PI, becomes 0, and therefore, the selector SL1 in FIG. 5 selects the clock signal CK1B as the selection clock signal SCK1. Thus, the current source transistor TS1 having the gate to which the clock signal CK1B is input turns ON to supply the node N1 with the current I1=1I when the clock signal CK1B is active.

Further, in the cases of PI<3:1>=1, 3, 5, 7, the first bit PI1 of the phase interpolation signal PI becomes 1, and therefore, the selector SL1 selects the clock signal CK2B as the selection clock signal SCK1. Thus, the current source transistor TS1 having the gate to which the clock signal CK2B is input turns ON to supply the node N1 with the current I2=1I when the clock signal CK2B is active.

Further, the selection clock signal SCK0 is input to the gate of the current source transistor TS0, and thus, the current source transistor TS0 supplies a current of 1I to the node N1. Then, in FIG. 6, in all the cases of PI<3:1>, the selector SL0 in FIG. 5 selects the clock signal CK1B as the selection clock signal SCK0. Thus, the current source transistor TS0 having the gate to which the clock signal CK1B is input turns ON to supply the node N1 with the current I1=1I when the clock signal CK1B is active.

For example, in FIG. 6, it is assumed that the phase interpolation signal is PI<3:1>=7. In this case, the current of I1=1I becomes to be supplied to the node N1 by the current source transistor TS0 when the clock signal CK1B is active, and the current of I2=1I+2I+4I=7I becomes to be supplied to the node N1 by the current source transistors TS1, TS2, and TS3 when the clock signal CK2B is active. Accordingly, the current ratio between I1 and I2 is set to 1:7 due to the phase interpolation signal of PI<3:1>=7. Thus, as described with reference to FIG. 3, the interpolation clock signal PICK obtained by performing the phase interpolation between the phase of CK1D and the phase of CK2D at the ratio of 7:1 is generated. That is, when the current ratio for making the current I2 higher is set based on the phase interpolation signal PI, the interpolation clock signal PICK having a phase closer to CK2D becomes to be generated.

Further, it is assumed that the phase interpolation signal is PI<3:1>=1 in FIG. 6. In this case, the current I1=1I+2I+4I=7I becomes to be supplied to the node N1 by the current source transistors TS0, TS2, and TS3 when the clock signal CK1B is active, and the current I2=1I becomes to be supplied to the node N1 by the current source transistor TS1 when the clock signal CK2B is active. Accordingly, the current ratio between I1 and I2 is set to 7:1 based on the phase interpolation signal of PI<3:1>=1. Thus, the interpolation clock signal PICK obtained by performing the phase interpolation between the phase of CK1D and the phase of CK2D at the ratio of 1:7 is generated. That is, when the current ratio for making the current I1 higher is set based on the phase interpolation signal PI, the interpolation clock signal PICK having a phase closer to CK1D becomes to be generated. Note that the signal CK1D corresponding to the clock signal CK1 corresponds to the interpolation clock signal PICK when the current ratio between I1 and I2 is set to, for example, 8:0, and the signal CK2D corresponding to the clock signal CK2 corresponds to the interpolation clock signal PICK when the current ratio between I1 and I2 is set to, for example, 0:8.

Figure 7:
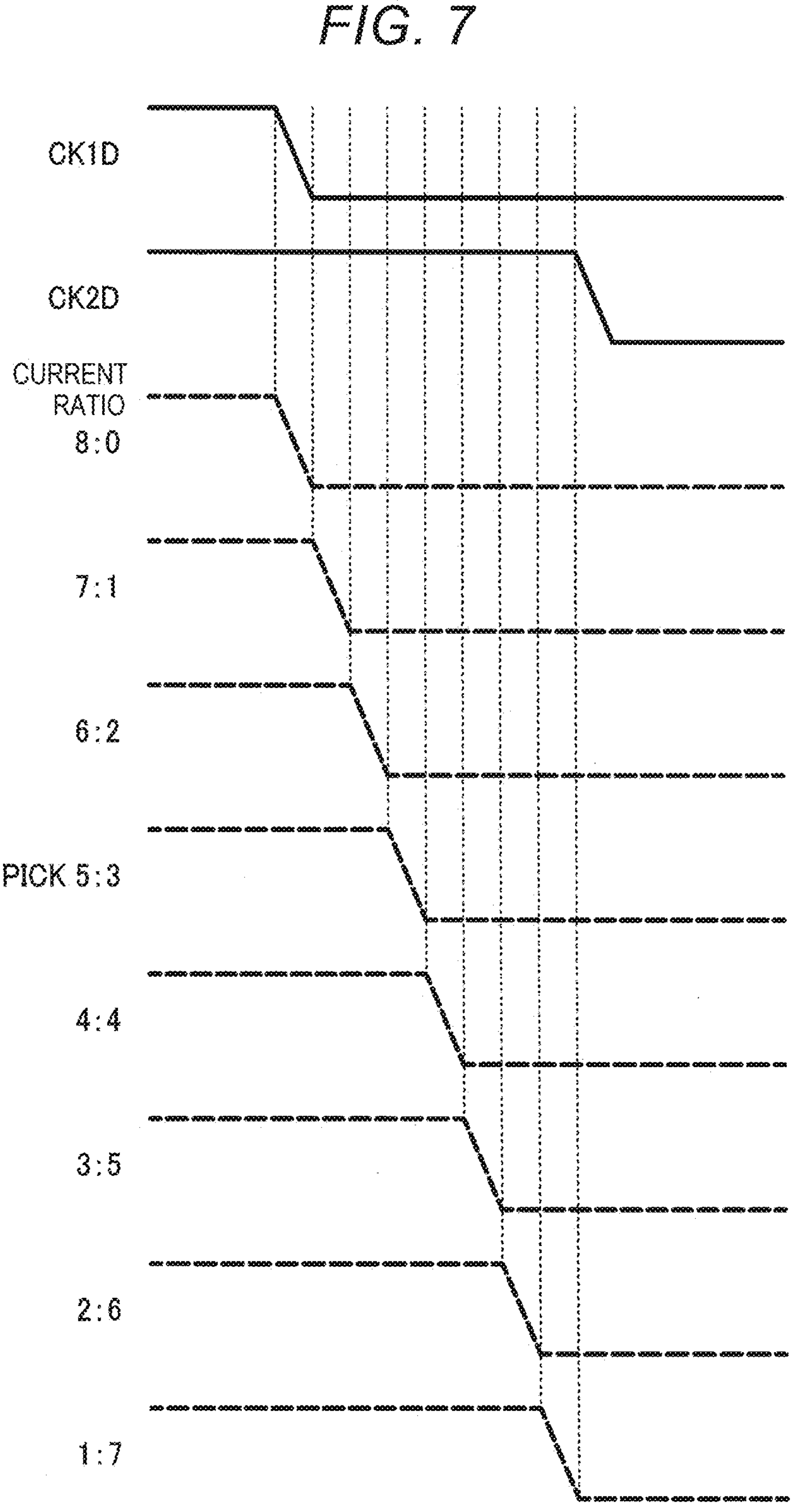
FIG. 7 is a signal waveform diagram illustrating an operation of the present embodiment.

FIG. 7 shows signal waveform examples of the interpolation clock signal PICK when the current ratio between I1 and I2 is set to 8:0, 7:1, 6:2, . . . , 1:7. In this way, by setting the current ratio between I1 and I2 in the current source circuit 40 by the current control circuit 50, it becomes possible to set the ratio of the phase interpolation of the interpolation clock signal PICK.

Figure 8:
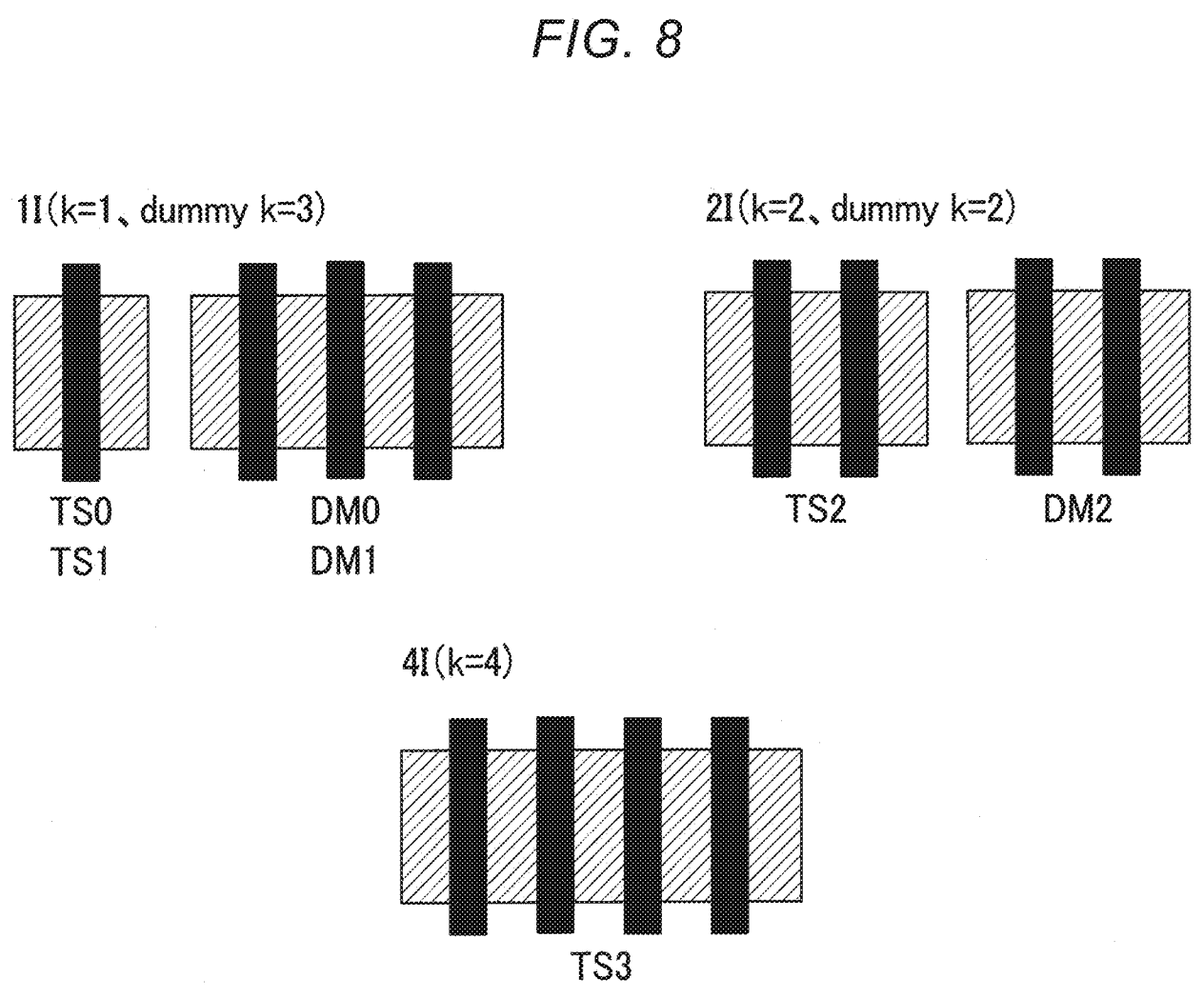

FIG. 8 is a layout arrangement example of the current source transistors TS0, TS1, TS2, and TS3 and the dummy transistors DM0, DM1, and DM2. As shown in FIG. 8, the current source transistor TS0 includes k=1 unit transistor, and the dummy transistor DM0 includes k=3 unit transistors. Similarly, the current source transistor TS1 is composed of k=1 unit transistor, and the dummy transistor DM1 is composed of k=3 unit transistors. Further, the current source transistor TS2 includes k=2 unit transistors, and the dummy transistor DM2 includes k=2 unit transistors. The current source transistor TS3 includes k=4 unit transistors.

Further, as shown in FIG. 4, the same selection clock signal SCK0 is input to the gate of the current source transistor TS0 where k=1 and the gate of the dummy transistor DM0 where k=3. Further, the same selection clock signal SCK1 is input to the gate of the current source transistor TS1 where k=1 and the gate of the dummy transistor DM1 where k=3. Further, the same selection clock signal SCK2 is input to the gate of the current source transistor TS2 where k=2 and the gate of the dummy transistor DM2 where k=2. Further, the selection clock signal SCK3 is input to the gate of the current source transistor TS3 where k=4. Accordingly, the total number of unit transistors having the gates to which the respective selection clock signals are input becomes the same value of k=4 among TS0 and DM0, TS1 and DM1, TS2 and DM2, and TS3, which results in the same gate area. Accordingly, it is possible to make the gate capacitances of the unit transistors to be added to the respective selection clock signals SCK0, SCK1, SCK2, and SCK3 equivalent to each other, and thus the rounding of the waveform due to the gate capacitance can be made equivalent among the selection clock signals SCK0, SCK1, SCK2, and SCK3. This makes it possible to improve the linearity of the phase interpolation of the interpolation clock signal PICK.

2. Circuit Device

Figure 9:
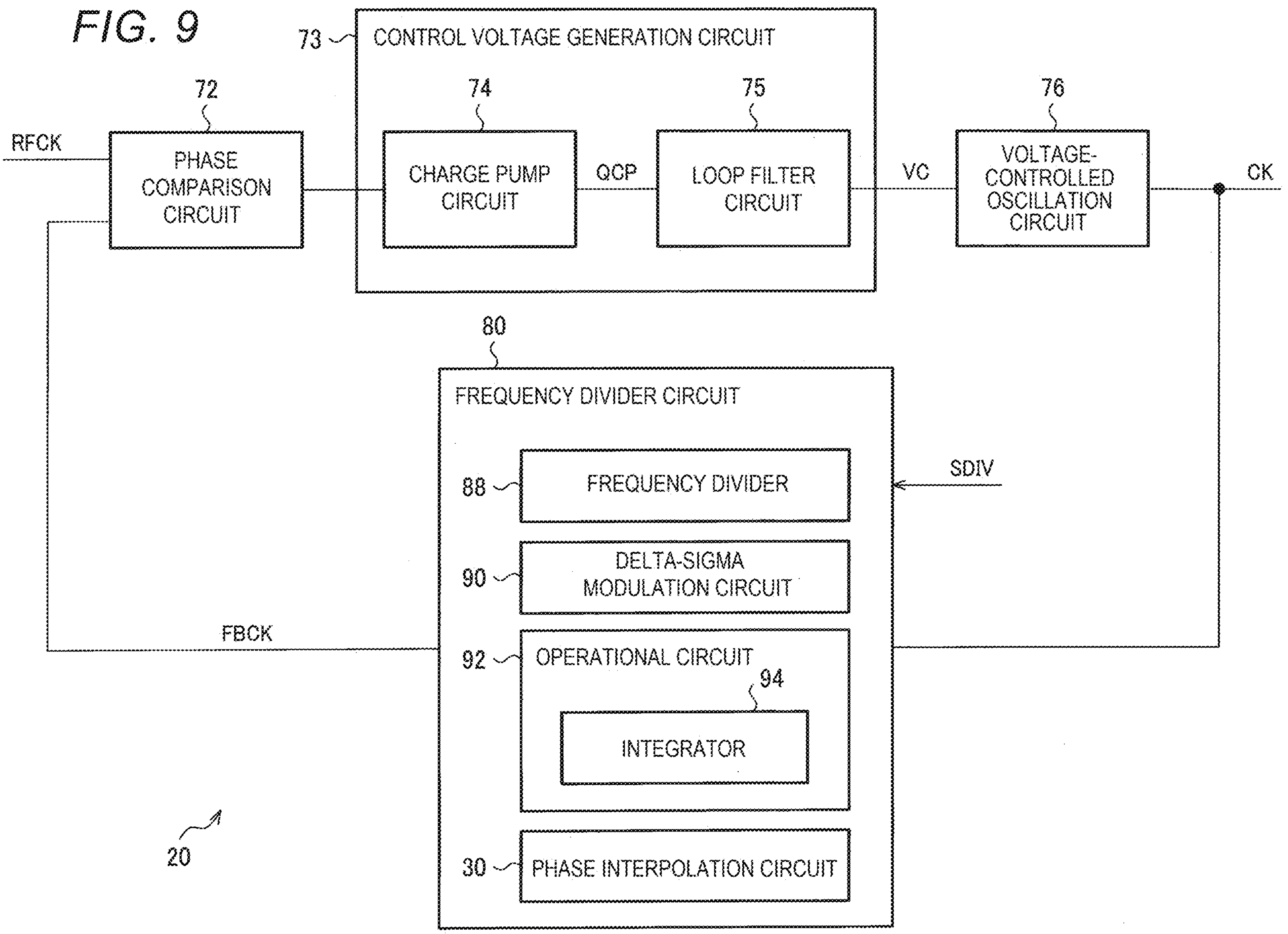
FIG. 9 is a diagram showing a configuration example of a circuit device according to the present embodiment.

FIG. 9 shows a configuration example of a circuit device 20 including the phase interpolation circuit 30 according to the present embodiment. The circuit device 20 includes a phase comparison circuit 72, a control voltage generation circuit 73, a voltage-controlled oscillation circuit 76, and a frequency divider circuit 80. A PLL (Phase-Locked Loop) circuit is realized by the circuit device 20 having this configuration. Specifically, a fractional-N PLL circuit is realized. The circuit device 20 is, for example, an integrated circuit device called an IC (Integrated Circuit). For example, the circuit device 20 is an IC manufactured by a semiconductor process and is a semiconductor chip in which circuit elements are formed on a semiconductor substrate. Note that the circuit device 20 is not limited to the configuration in FIG. 9, and various modifications such as omission of some of these constituents, addition of other constituents, or replacement of some of these constituents with other constituents can be made.

The phase comparison circuit 72 performs phase comparison between a reference clock signal RFCK and a feedback clock signal FBCK. The reference clock signal RFCK is, for example, an oscillation clock signal. For example, the phase comparison circuit 72 compares the phase of the reference clock signal RFCK with the phase of the feedback clock signal FBCK, and then outputs a signal corresponding to the phase difference between the reference clock signal RFCK and the feedback clock signal FBCK as a signal of a phase comparison result. For example, an up signal and a down signal are output as the signals of the phase comparison result. Note that the phase comparison circuit 72 may be a phase comparison circuit used in a sampling PLL or a sub-sampling PLL. For example, the phase comparison may be realized by providing the phase comparison circuit 72 with a sampling circuit that samples a slope signal generated based on the feedback clock signal FBCK with the reference clock signal RFCK to output a sampling voltage. In this case, the sampling voltage of the sampling circuit becomes a voltage corresponding to the phase difference between the reference clock signal RFCK and the feedback clock signal FBCK.

The control voltage generation circuit 73 generates a control voltage VC based on the phase comparison result in the phase comparison circuit 72. The control voltage generation circuit 73 includes, for example, a charge pump circuit 74 and a loop filter circuit 75. The charge pump circuit 74 performs a charge pump operation based on the signal of the phase comparison result from the phase comparison circuit 72. The loop filter circuit 75 performs filter processing on an output signal QCP of the charge pump circuit 74. Thus, the control voltage VC for controlling the oscillation of the voltage-controlled oscillation circuit 76 is generated.

The voltage-controlled oscillation circuit 76 performs an oscillation operation based on the control voltage VC to generate a clock signal CK. The voltage-controlled oscillation circuit 76 may be realized by, for example, an LC type oscillation circuit using an inductor and a capacitor, or may be realized by a loop type oscillation circuit in which a plurality of inverter circuits is coupled in a loop shape.

The frequency divider circuit 80 performs a frequency dividing operation of the clock signal CK to generate the feedback clock signal FBCK. For example, the frequency divider circuit 80 outputs a signal with a frequency obtained by dividing the frequency of the clock signal CK at a division ratio set by division ratio setting information SDIV as the feedback clock signal FBCK. For example, in the present embodiment, a fractional divider is realized as the frequency divider circuit 80 by using delta-sigma modulation. For example, when the frequency of the oscillation of the voltage-controlled oscillation circuit 76 is denoted by fvco and the division ratio represented by a division ratio setting value is denoted by DIV, the frequency of the feedback clock signal FBCK is obtained as fvco/DIV.

Further, in the present embodiment, the frequency divider circuit 80 includes the phase interpolation circuit 30, and the interpolation clock signal PICK output from the phase interpolation circuit 30 is output by the frequency divider circuit 80 as the feedback clock signal FBCK. For example, the phase interpolation circuit 30 generates the interpolation clock signal PICK from the clock signal CK1 and the clock signal CK2 based on the clock signal CK. For example, the phase interpolation circuit 30 generates the interpolation clock signal PICK using the clock signal CK and a clock signal XCK obtained by inverting the clock signal CK as the clock signal CK1 and the clock signal CK2, respectively. Further, the phase interpolation circuit 30 may generate the interpolation clock signal PICK using clock signals obtained by integer-dividing the clock signal CK as the clock signals CK1, CK2. Further, as will be described later, a plurality of multiphase clock signals may be generated from the clock signal CK, and the phase interpolation circuit 30 may generate the interpolation clock signal PICK by using two of the plurality of multiphase clock signals as the clock signals CK1, CK2.

Specifically, as shown in FIG. 9, the frequency divider circuit 80 includes a frequency divider 88, a delta-sigma modulation circuit 90, an operational circuit 92, and the phase interpolation circuit 30. The operational circuit 92 includes an integrator 94. The delta-sigma modulation circuit 90 performs delta-sigma modulation based on a fractional portion (f) of the division ratio set by the division ratio setting information SDIV. The integrator 94 of the operational circuit 92 generates the phase interpolation signal PI by performing integration processing of output values of the delta-sigma modulation circuit 90. Further, integer division by the frequency divider 88 is performed based on an integer portion (N) of the division ratio set by the division ratio setting information SDIV. According to such a configuration, it becomes possible to realize the fractional-N PLL circuit capable of outputting the clock signal CK having a frequency obtained by multiplying the frequency of the reference clock signal RFCK input thereto by any multiplication numbers including a fractional portion.

For example, the delta-sigma modulation circuit 90 can be realized by a difference unit (an adder) that obtains a difference between an input value and a feedback value, an integrator that performs time integration of a difference result, a quantizer that calculates a quantization error of an integration result, and a delay unit that feeds back an output value. As the delta-sigma modulation circuit 90, a circuit that performs delta-sigma modulation such as first-order, second-order, or third-order delta-sigma modulation can be used. For example, a fractional divider is configured with the frequency divider 88 and the delta-sigma modulation circuit 90, and the fractional-N PLL circuit can be realized by the fractional divider. For example, the delta-sigma modulation circuit 90 performs the delta-sigma modulation based on the fractional portion of the division ratio by the division ratio setting information SDIV to output delta-sigma modulation data. For example, the delta-sigma modulation circuit 90 outputs n-bit delta-sigma modulation data. For example, it is assumed that the delta-sigma modulation circuit 90 outputs 4-bit delta-sigma modulation data with the third-order delta-sigma modulation. In this case, digital data which represents (1101)=−3, (1110)=−2, (1111)=−1, (0000)=0, (0001)=+1, (0010)=+2, (0011)=+3, and (0100)=+4 is output. The integrator 94 performs the integration processing of the values of the delta-sigma modulation data to generate the phase interpolation signal PI. What phase in the phase range of 0 to 2π the phase of the interpolation clock signal PICK corresponds to is instructed by the phase interpolation signal PI. Further, when the value of the integration result of the delta-sigma modulation data exceeds, for example, a value in the phase range of 0 to 2π, the integrator 94 outputs a carry signal. Then, by adding a value according to the carry signal to the integer portion of the division ratio by the division ratio setting information SDIV, an integer division ratio of the frequency divider 88 is set.

Figure 10:
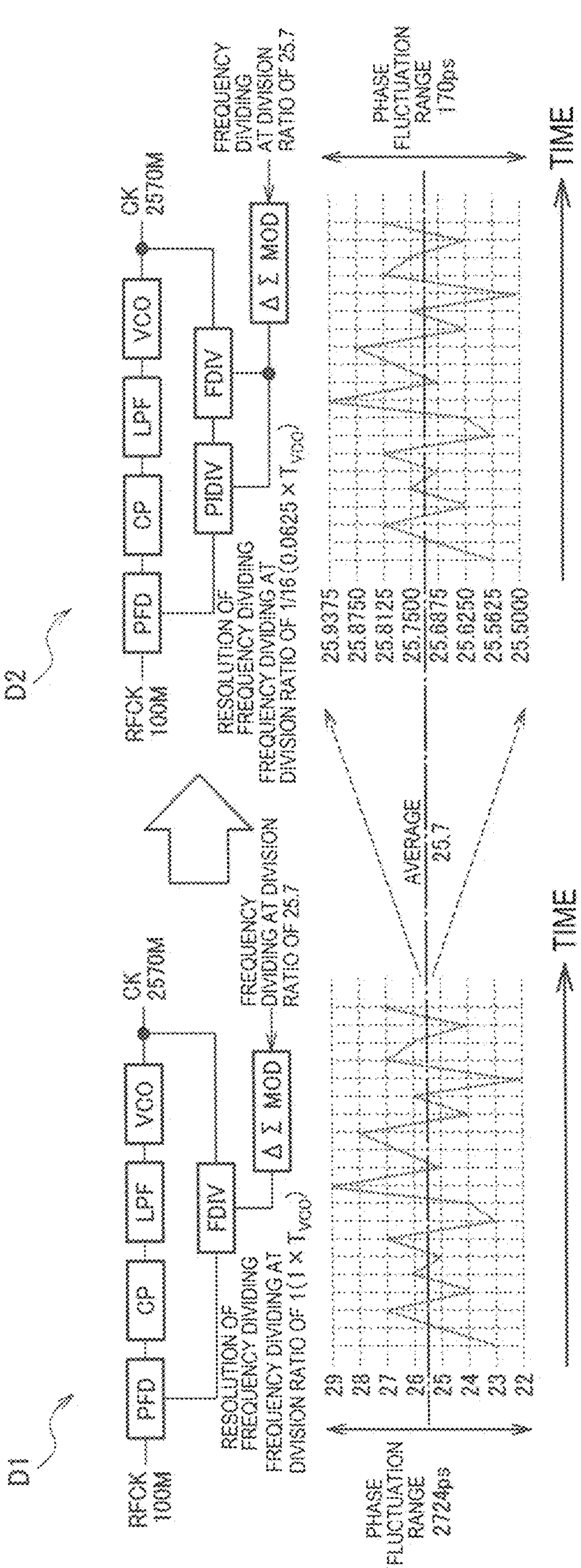
FIG. 10 is a diagram illustrating a method of providing a phase interpolation circuit to a PLL circuit.

For example, D1 in FIG. 10 is a configuration example of the fractional-N PLL circuit using the fractional divider with the delta-sigma modulation. Further, D2 in FIG. 10 is a configuration example of the fractional-N PLL circuit obtained by further providing the phase interpolation circuit 30 to the configuration of D1. In D1, D2 shown in FIG. 10, PFD, CP, LPF, and VCO respectively correspond to the phase comparison circuit 72, the charge pump circuit 74, the loop filter circuit 75, and the voltage-controlled oscillation circuit 76. Further, ΔΣ MOD corresponds to the delta-sigma modulation circuit 90, and FDIV corresponds to the frequency divider 88. Further, PIDIV in the configuration of D2 shown in FIG. 10 corresponds to the phase interpolation circuit 30. In D1, D2 shown in FIG. 10, a clock signal CK with 2570 MHz is generated from the reference clock signal RFCK with 100 MHz by setting a division ratio of 25.7 to the frequency divider circuit 80 as the division ratio setting information SDIV.

Further, in the case of the configuration of D1 in FIG. 10, the fractional divider is realized by the delta-sigma modulation circuit 90 performing the delta-sigma modulation on the integer division ratio. For example, the delta-sigma modulation is performed so that the average value of the division ratio becomes 25.7. However, in the case of the configuration of D1 in FIG. 10, since the modulation of the integer division ratio can only be performed, the phase noise becomes worse due to the quantization noise in the delta-sigma modulation. That is, the phase fluctuation range increases and the phase noise becomes worse.

In contrast, in the case of the configuration of D2 in FIG. 10, the interpolation clock signal PICK obtained by performing the phase interpolation between an integer divided clock signal is generated, and is output as the feedback clock signal FBCK. Accordingly, in the case of the configuration of D2, since the modulation at the fractional division ratio is performed, it is possible to make the resolution of the fractional frequency dividing finer. Accordingly, it becomes possible to make the phase fluctuation range smaller compared to D1, and to reduce the phase noise.

Figure 11:
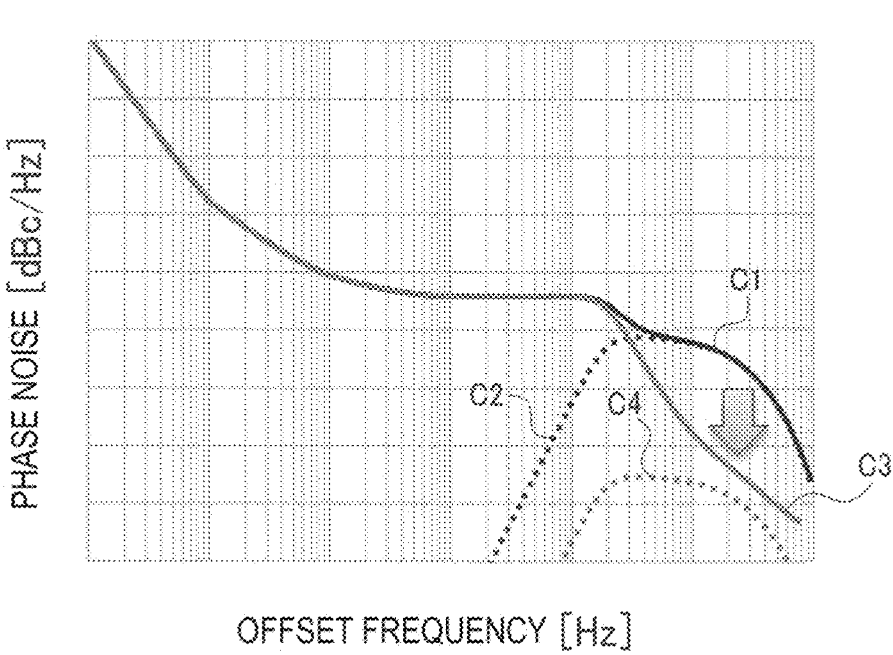
FIG. 11 is a diagram showing a characteristic example of phase noise in the PLL circuit.

For example, C1 in FIG. 11 is a phase noise characteristic in the case of the configuration of D1 in FIG. 10. In the characteristic of C1, the phase noise in a high frequency band becomes worse due to the noise caused by the delta-sigma modulation indicated by C2. Meanwhile, C3 in FIG. 11 is a phase noise characteristic in the case of the configuration of D2 in FIG. 10. In the characteristic of C3, since the noise caused by the delta-sigma modulation can be reduced compared to C2 as indicated by C4, it becomes possible to reduce the phase noise.

Figure 12:
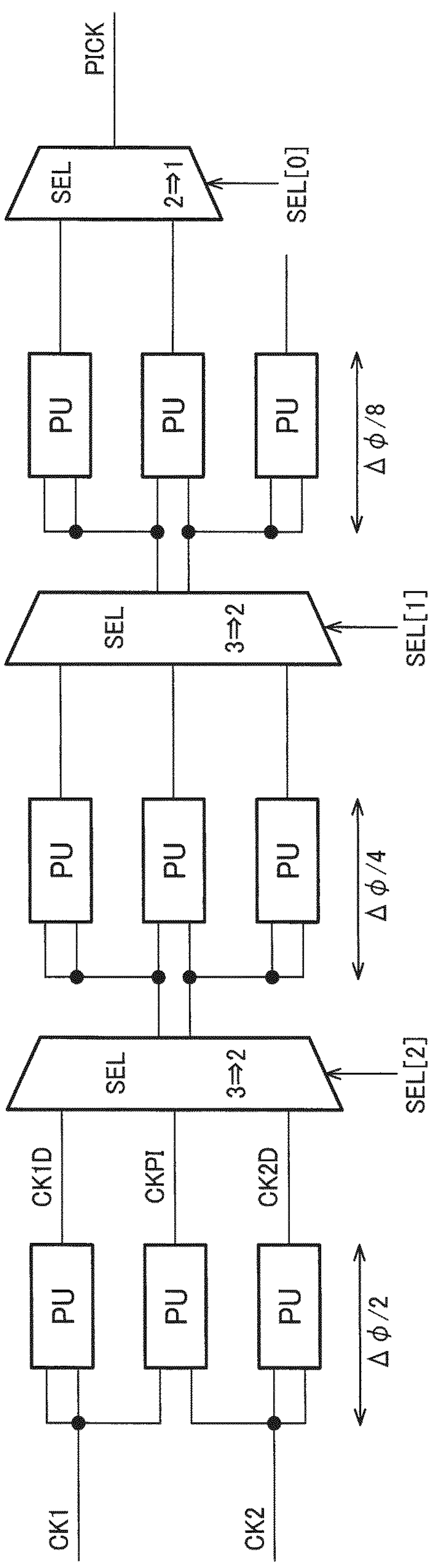
FIG. 12 is a diagram illustrating a phase interpolation circuit according to a comparative example.

FIG. 12 is a configuration of a phase interpolation circuit according to a comparative example, and corresponds to the phase interpolation circuit in Makihiko Katsuragi, Tn Aravind, Kenichi Okada, Akira Matsuzawa "Consideration for Accurate Phase Interpolator" The Institute of Electronics, Information, and Communication Engineers Society Conference, September 2015 described above. In the phase interpolation circuit according to the comparative example, for example, in order to divide the phase by $2^n$ (n=3 in the example in FIG. 12), the phase-dividing units PU are coupled in multiple stages. For example, a selector in the first stage selects two clock signals based on a selection signal SEL[2] from three clock signals (CK1D, CKPI, and CK2D) from three phase-dividing units PU in the first stage. Further, a selector in the second stage selects two clock signals based on a selection signal SEL[1] from the three clock signals from three phase-dividing units PU in the second stage. Further, a selector in the third stage selects one clock signal based on a selection signal SEL[0] from the two clock signals from two phase-dividing units PU in the third stage, and outputs the clock signal thus selected as the interpolation clock signal PICK.

In the comparative example in FIG. 12, the phase-dividing units PU are coupled in multiple stages to form the phase interpolation circuit. Therefore, there arises a problem that the linearity of the phase thus divided is deteriorated due to a variation in threshold voltage of transistors in the respective phase-dividing units coupled in multiple stages. That is, in the comparative example in FIG. 12, since one phase-dividing unit that performs the phase division is configured with pipeline coupling, the linearity of the divided phases is deteriorated, and the variation between the samples is increased due to the influence of the variation in the threshold voltage between the transistors used in the respective phase-dividing units. Further, since there is adopted the configuration in which the phase-dividing units are coupled in a pipeline manner, the wiring becomes complicated, and the variation in the parasitic capacitance between the wirings harmfully affects the linearity of the phase interpolation.

As described above, in the comparative example in FIG. 12, each of the phase-dividing units PU divides the phase difference between the two clock signals by half, and these phase-dividing units PU are coupled in the j-stage (j=3 in the example in FIG. 12) pipeline coupling configuration to thereby realize the phase division of $(1/2)^j$. In contrast, in the present embodiment, for example, the phase division of $(1/2)^j$ is realized using one phase interpolation circuit 30. For example, in order to realize the phase division of $(1/2)^j$, as described in FIG. 4, the current source circuit 40 is configured with the current source transistors TS0 to TS3 in which the current supply capability ratio is 1 to $2^{(j-1)}$ times (j is a continuous integer equal to or greater than 1). According to the present embodiment having such a configuration, the linearity of the divided phases can be improved and the variation among the samples can be reduced compared to the comparative example. Further, the wiring can be simplified compared to the comparative example, and it becomes possible to realize a reduction in scale and a reduction in power consumption of the circuit.

Figure 13:
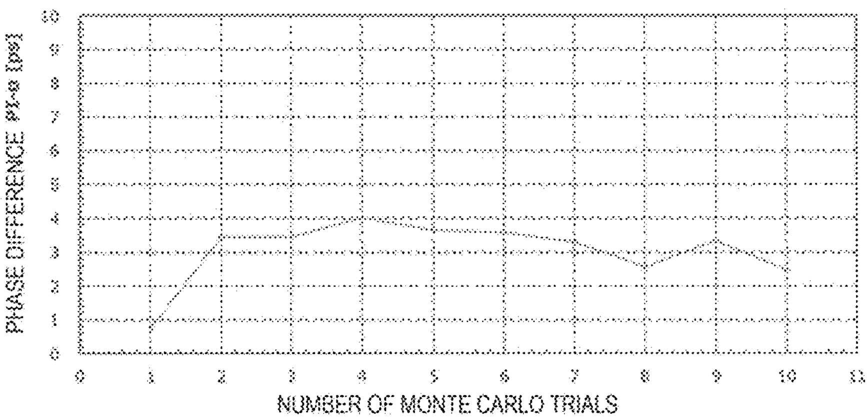
FIG. 13 is a diagram showing a simulation result of a phase difference variation in the comparative example.
Figure 14:
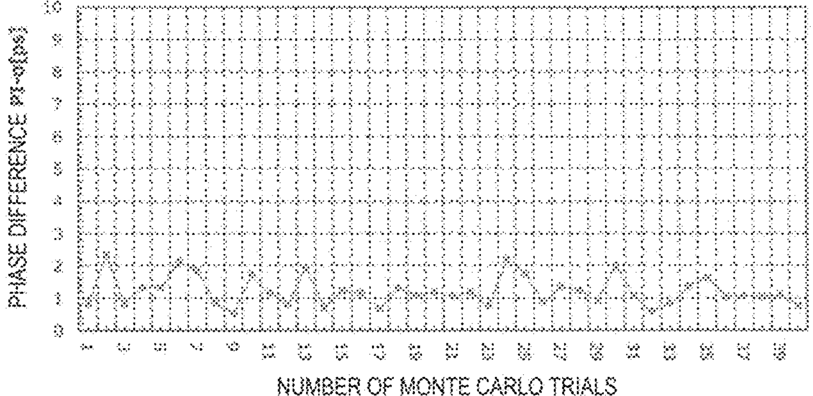
FIG. 14 is a diagram showing a simulation result of a phase difference variation in the present embodiment.
Figure 15:
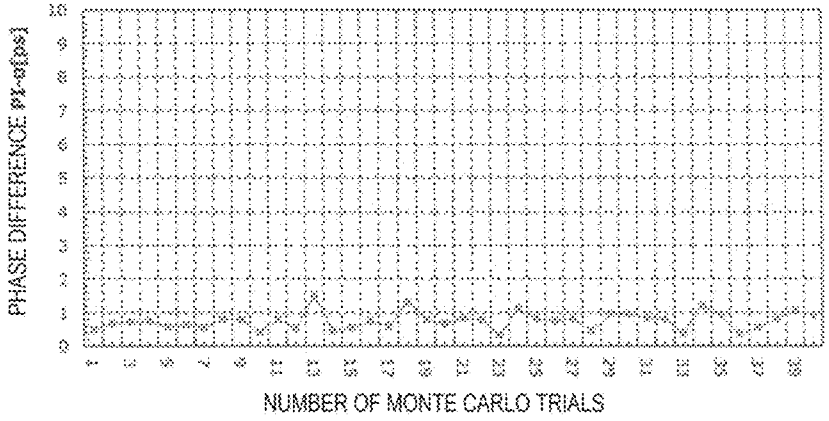
FIG. 15 is a diagram showing a simulation result of the phase difference variation in the present embodiment.

For example, FIG. 13 is a simulation result of the phase difference variation in the case of the comparative example in FIG. 12 with the Monte Carlo method. FIGS. 14 and 15 show simulation results of the phase difference variation in the present embodiment with the Monte Carlo method. In FIGS. 13, 14, and 15, the horizontal axis represents the number of Monte Carlo trials, and the vertical axis represents σ in the phase difference variation. The phase difference variation is a variation in the difference between the ideal interpolation phase and the actual interpolation phase according to the phase interpolation. As shown in FIG. 13, while the phase difference variation is large in the comparative example, the phase difference variation can be made smaller in FIGS. 14 and 15 compared to FIG. 13. As a result, it becomes possible to reduce the phase noise. Note that FIG. 15 is a simulation result in the case of the configuration in FIGS. 18 and 19 to be described later, in which the phase difference variation can further be reduced compared to FIG. 14.

Figure 16:
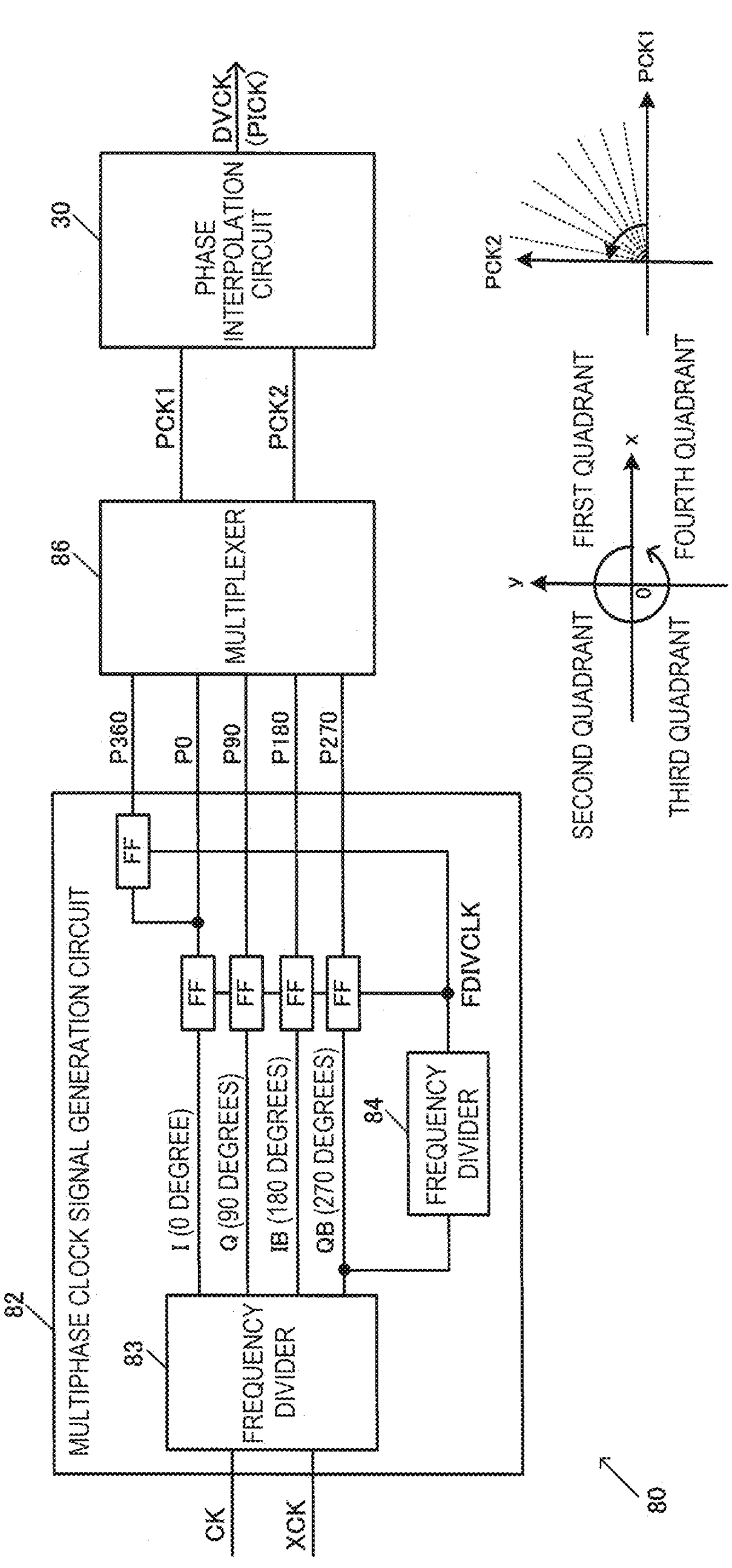
FIG. 16 is a diagram showing a configuration example of a phase interpolation type frequency divider circuit.
Figure 17:
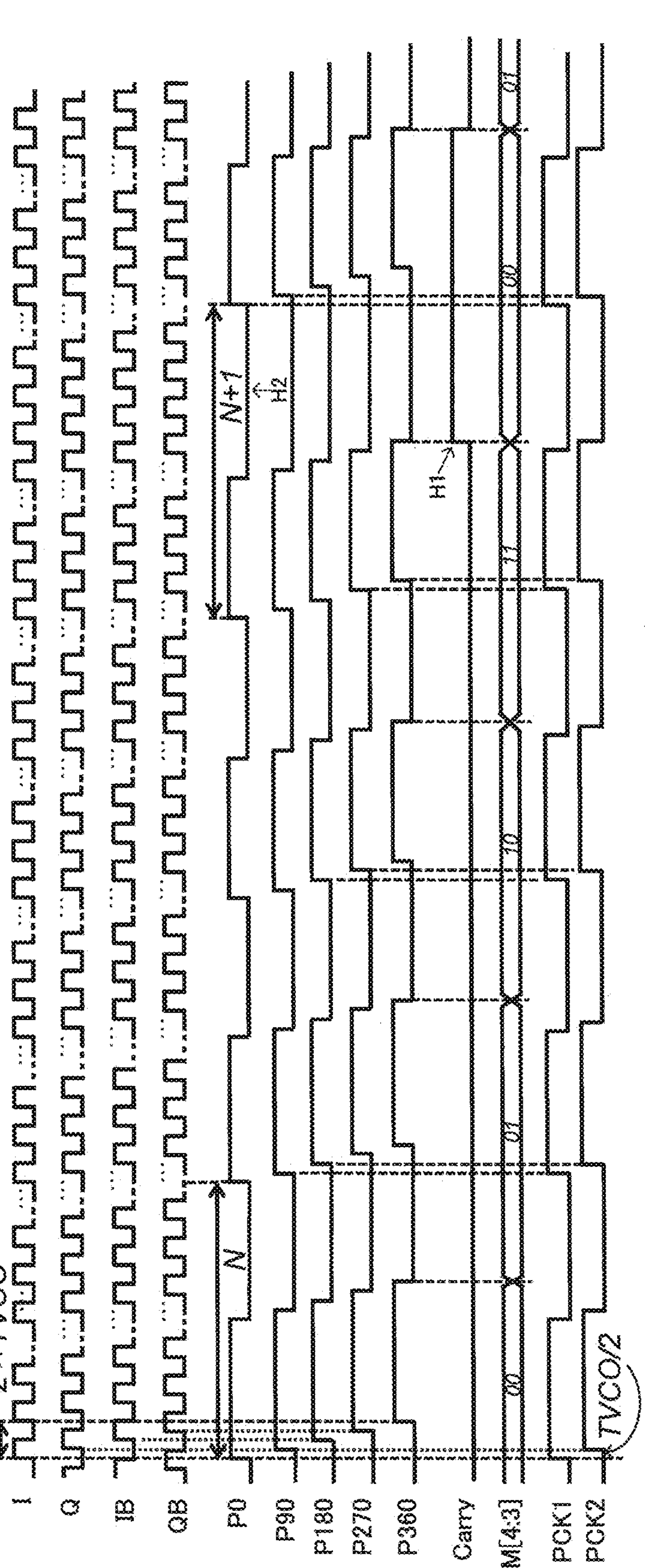
FIG. 17 is a signal waveform diagram illustrating an operation of the phase interpolation type frequency divider circuit.

FIG. 16 illustrates a further detailed configuration example of the frequency divider circuit 80, and FIG. 17 shows a signal waveform example for describing the operation of the frequency divider circuit in FIG. 16. The frequency divider circuit 80 in FIG. 16 includes a multiphase clock signal generation circuit 82, a multiplexer 86, and the phase interpolation circuit 30. The multiphase clock signal generation circuit 82 includes frequency dividers 83, 84 and five flip-flop circuits FF.

The frequency divider 83 is an orthogonal clock generation circuit. Specifically, the clock signal CK and the clock signal XCK obtained by inverting the clock signal CK (having 180° with respect to the phase of the clock signal CK) are input to the orthogonal clock generation circuit (83), and the orthogonal clock generation circuit generates clock signals of 90°/180° orthogonal to each other from these signals, and outputs signals I (0°), Q (90°), IB (180°), and QB (270°). When the period of the clock signal CK is denoted by TVCO, the periods of the signals I, Q, IB, and QB frequency-divided at the division ratio of 2 become 2×TVCO as shown in FIG. 17. That is, the frequencies of the signals I, Q, IB, and QB become a half of the frequency of the clock signal CK. Further, the signals Q, IB, and QB are delayed by 90 degrees, 180 degrees, and 270 degrees with respect to the signal I, respectively. As described above, the signals I, Q, IB, and QB are shifted in phase by 90 degrees from each other.

The frequency divider 84 is called a feedback divider (FDIV). Specifically, the divider 84 performs the frequency division on the signal QB at the preset integer division ratio N to output a signal FDIVCLK. Then, by inputting the signal FDIVCLK to the CK terminals of the flip-flop circuits FF having D terminals to which the signals I, Q, IB, and QB are respectively input to perform sampling, such frequency-divided clock signals P0, P90, P180, and P270 as shown in FIG. 17 are output from Q terminals of the respective flip-flop circuits FF. Further, by inputting the signal FDIVCLK to a CK terminal of the flip-flop circuit FF having a D terminal to which the frequency-divided clock signal P0 is input to perform sampling, a frequency-divided clock signal P360 is output from a Q terminal of that flip-flop circuit FF.

As shown in FIG. 17, the frequency-divided clock signals P0, P90, P180, P270, and P360 are signals obtained by performing the frequency division on the signals I, Q, IB, QB, and I at the integer division ratio N by the frequency divider 84. For example, when assuming the period of the signals I, Q, IB, QB, and I as 2×TVCO, the period of the frequency-divided clock signals P0, P90, P180, P270, and P360 becomes N×2×TVCO. Further, the frequency-divided clock signals P0, P90, P180, P270, and P360 are signals the signal levels of which change at edges corresponding to the edges of the signals I, Q, IB, QB, and I, respectively. Further, a phase difference between P0 and P90 corresponds to a phase difference between I and Q, and a phase difference between P90 and P180 corresponds to a phase difference between Q and IB. A phase difference between P180 and P270 corresponds to a phase difference between IB and QB, and a phase difference between P270 and P360 corresponds to a phase difference between QB and I.

In this manner, the multiphase clock signal generation circuit 82 outputs the plurality of frequency-divided clock signals P0, P90, P180, P270, and P360 which are obtained by frequency-dividing the clock signals CK and XCK at the integer division ratio of N×2 and are different in phase from each other.

For example, the frequency divider 84 in FIG. 16 corresponds to the frequency divider 88 in FIG. 9. For example, the delta-sigma modulation circuit 90 performs the delta-sigma modulation based on the fractal portion of the division ratio by the division ratio setting information SDIV, and the integrator 94 performs the integration processing of the output values of the delta-sigma modulation circuit. Then, the operational circuit 92 outputs an integer division control code for setting the integer division ratio N to the frequency divider 84. Further, the operational circuit 92 outputs an interpolation control code based on the integrated value of the integrator to the phase interpolation circuit 30 and the multiplexer 86.

The multiplexer 86 selects an i-th frequency-divided clock signal PCK1 and an (i+1)-th frequency-divided clock signal PCK2 from the frequency-divided clock signals P0, P90, P180, P270, and P360 based on, for example, M[4:3] which is an upper bit of M[4:0] which is the interpolation control code from the control circuit. For example, when the first quadrant of 0 to 90 degrees is determined based on M[4:3] which is the upper bit of the interpolation control code, the frequency-divided clock signals P0, P90 are selected as PCK1 and PCK2, and when the second quadrant of 90 to 180 degrees is determined, P90 and P180 are selected as PCK1 and PCK2. Further, when the third quadrant of 180 to 270 degrees is determined based on M[4:3] which is the upper bit of the interpolation control code, P180 and P270 are selected as PCK1 and PCK2, and when the fourth quadrant of 270 to 360 degrees is determined, P270 and P360 are selected as PCK1 and PCK2.

Then, the phase interpolation circuit 30 outputs, as the frequency-divided clock signal DVCK, an interpolation clock signal selected based on, for example, M[2:0] which is a lower bit of M[4:0] as the interpolation control code, from a plurality of interpolation clock signals generated by the phase interpolation based on the i-th frequency-divided clock signal PCK1 and the (i+1)-th frequency-divided clock signal PCK2. The frequency-divided clock signal DVCK corresponds to the interpolation clock signal PICK. Here, i is an integer no smaller than 1. Further, PCK1 and PCK2 are also contained in the interpolation clock signals to be the selection target. For example, it is assumed that the first quadrant is determined based on M[4:3] which is the upper bit of the interpolation control code, and the frequency-divided clock signals P0, P90 are selected as PCK1 and PCK2. In this case, the phase interpolation circuit 30 outputs, as the frequency-divided clock signal DVCK, an interpolation clock signal selected based on, for example, M[2:0] which is a lower bit of the interpolation control code, from a plurality of interpolation clock signals generated by eight-fraction phase interpolation based on the i-th frequency-divided clock signal PCK1=P0 and the (i+1)-th frequency-divided clock signal PCK2=P90.

In this way, the phase interpolation circuit 30 selects the frequency-divided clock signal DVCK, which is a clock signal for phase comparison with the reference clock signal RFCK, from the plurality of interpolation clock signals generated by the phase interpolation based on the i-th frequency-divided clock signal PCK1 and the (i+1)-th frequency-divided clock signal PCK2 of the plurality of frequency-divided clock signals PC, P90, P180, P270, and P360 based on the interpolation control code. In this way, it becomes possible to realize the phase interpolation type frequency divider circuit 80. According to the phase interpolation type frequency divider circuit 80, since the interpolation clock signal phase-divided with high resolution is used, it becomes possible to reduce the range of the fluttering of the frequency due to the delta-sigma modulation and to generate the clock signal CK with the phase noise reduced.

For example, in FIG. 16, the phase is divided into four by the multiphase clock signal generation circuit 82, and the phase is divided into eight phases by the phase interpolation circuit 30 to thereby perform the 32-fraction phase division. Then, any one of the clock signals having the phases divided into 32 is selected by the interpolation control code based on the integrated value of the integrator 94 for integrating the outputs of the delta-sigma modulation circuit 90, and is then output as the frequency-divided clock signal DVCK. In this case, the phases are continuously integrated by the integrator 94 for integrating the outputs of the delta-sigma modulation circuit 90, and the carry signal is output from the operational circuit 92 to the frequency divider 84 as indicated by H1 in FIG. 17 at, for example, a timing of the transition from 31 to 0 in the 32 divisional phases, that is, at a timing when the phase makes one lap. As a result, as indicated by H2, a carry up of the integer division ratio of the frequency divider 84 from N to N+1 occurs. Note that at the timing of the transition from 0 to 31 in the 32 divisional phases, a carry down signal is output from the operational circuit 92 to the frequency divider 84, and the integer division ratio of the frequency divider 84 is carried down.

As described above, in FIG. 16, the eight-fraction phase interpolation in each of the first quadrant to the fourth quadrant is performed by the phase interpolation circuit 30. For example, PCK1 in FIG. 15 corresponds to the clock signal CK1 which is the first clock signal, and PCK2 corresponds to the clock signal CK2 which is the second clock signal. Further, when the circuit in the comparative example in FIG. 12 is used as the phase interpolation circuit 30, the phase difference variation becomes large as shown in FIG. 13, and the phase noise becomes worse.

In this regard, in the present embodiment, the eight-fraction phase interpolation in each quadrant in FIG. 16 is performed by the phase interpolation circuit 30 having the configuration described with reference to FIGS. 1 to 6. Thus, as shown in FIG. 14, it becomes possible to reduce the phase difference variation and to reduce the phase noise compared to FIG. 13.

Figure 18:
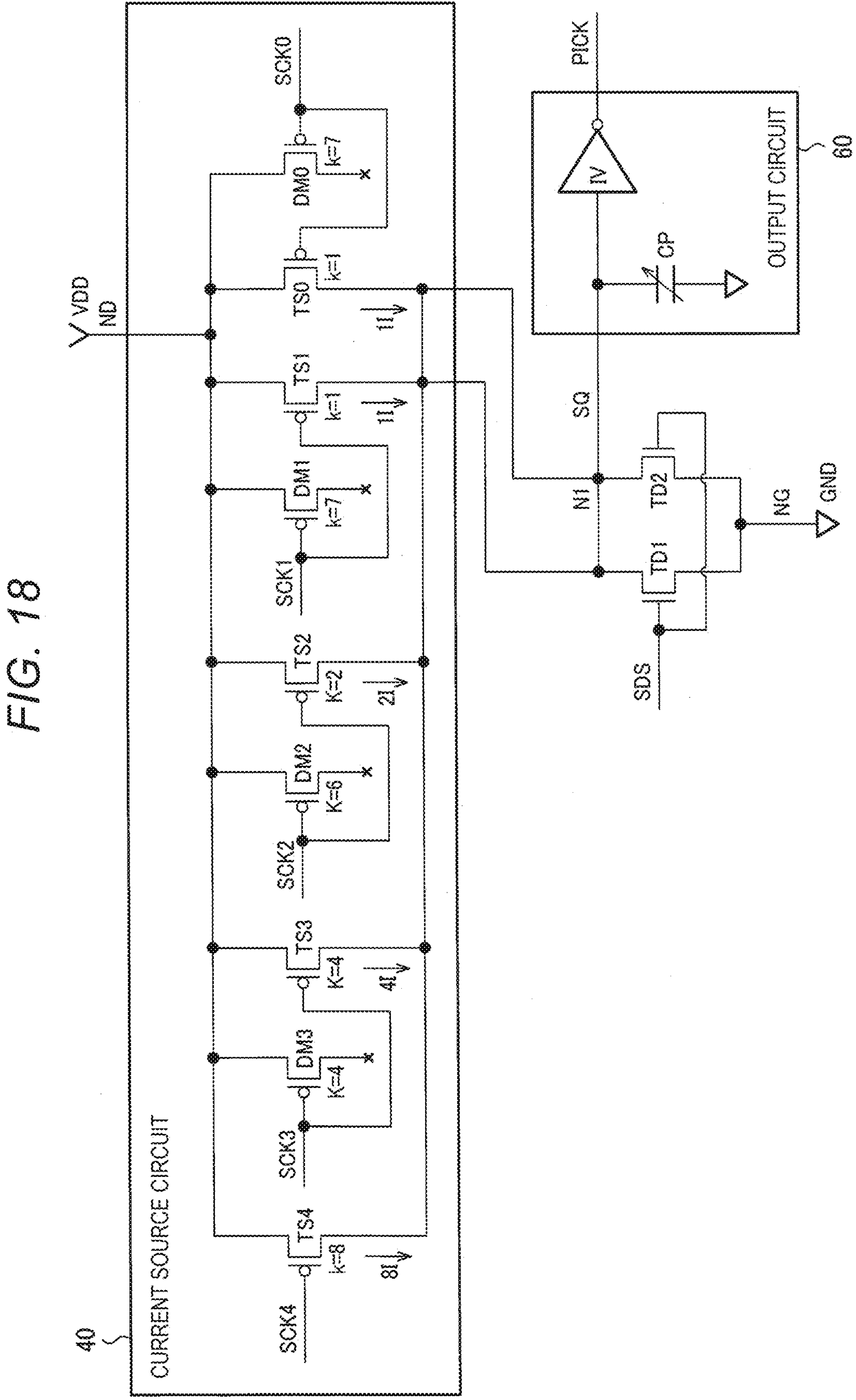
FIG. 18 is a diagram showing another configuration example of the current source circuit.
Figure 19:
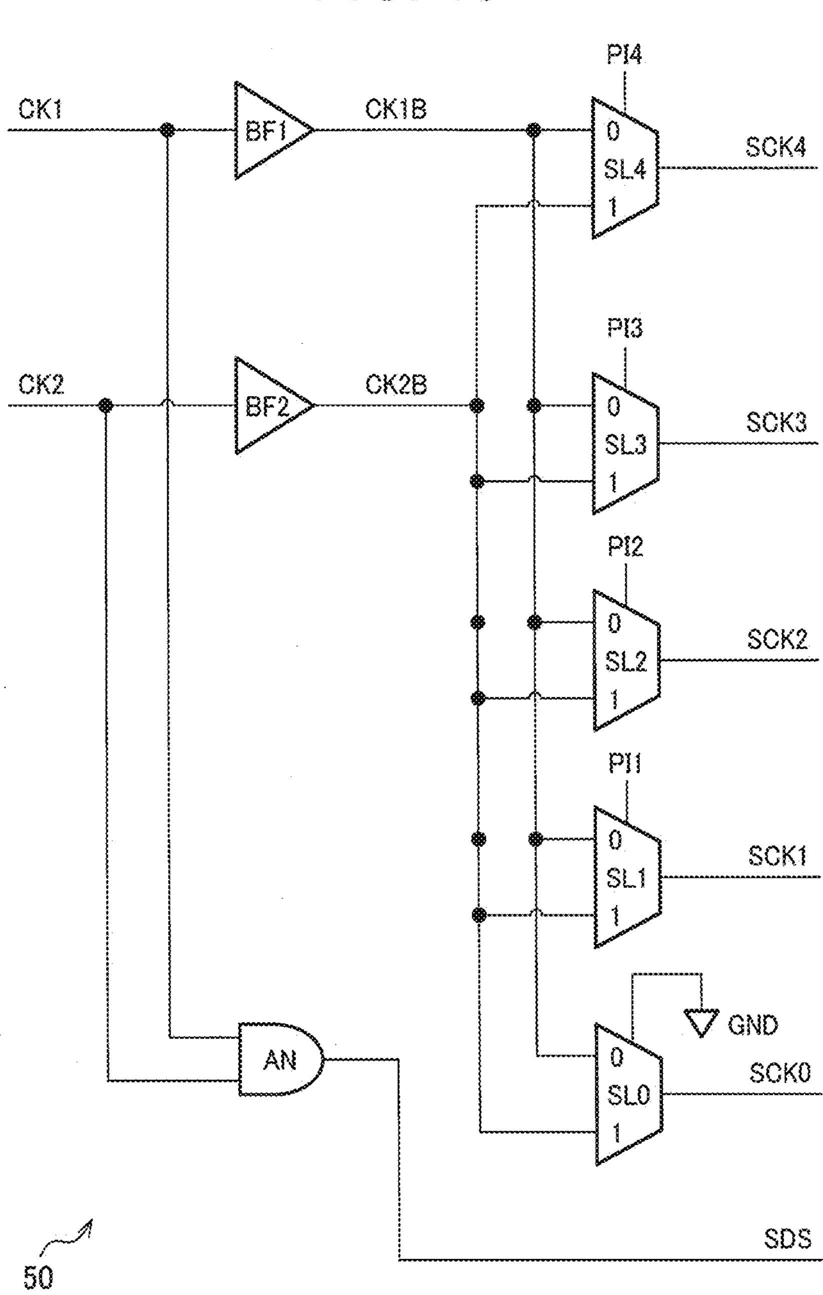
FIG. 19 is a diagram showing another configuration example of the current control circuit.

FIGS. 18 and 19 show another configuration example of the phase interpolation circuit 30. While FIGS. 4 and 5 show the configuration examples when performing the eight-fraction phase interpolation, FIGS. 18 and 19 show a configuration example when performing 16-fraction phase interpolation.

In FIG. 18, a current source transistor TS4 and a dummy transistor DM3 are further provided to the current source circuit 40 in FIG. 4. Further, in FIG. 19, a selector SL4 that outputs a selection clock signal SCK4 is further provided to the current control circuit 50 in FIG. 5. Further, in FIG. 18, k which represents the number of unit transistors in the dummy transistors DM0, DM1, and DM2 is different, and is set to k=7 in DM0 and DM1, and is set to k=6 in DM2. Further, the number of unit transistors in the dummy transistor DM3 is set to k=4. That is, while the total number KT of the unit transistors in the current source transistor and the dummy transistor is KT=4 in FIG. 4, the total number is KT=8 in FIG. 18. KT=8 corresponds to the number of unit transistors in the current source transistor TS4, and the current source transistor TS4 supplies a current of 8I to the node N1.

FIG. 20 is a truth table describing the operation of the phase interpolation circuit 30 in FIGS. 18 and 19. As shown in FIG. 20, in FIGS. 18 and 19, PI<4:1> in 4 bits is input to the current source circuit 40 as the phase interpolation signal PI. Further, in FIG. 20, by further providing the current source transistor TS4 having the gate to which the selection clock signal SCK4 is input, and supplying a current of 8I, setting of the current ratio from 1:15 to 16:0 is performed. This makes it possible to perform the 16-fraction phase interpolation.

Further, according to the configuration shown in FIGS. 18 and 19, it becomes unnecessary to provide the multiphase clock signal generation circuit 82 and the multiplexer 86 for generating the frequency-divided clock signals corresponding to the respective quadrants as shown in FIG. 16, and thus, the reduction in circuit scale can be achieved. When the configuration in FIGS. 18 and 19 is used, for example, it is sufficient to input the clock signals CK1, CK2 based on the frequency-divided clock signal of, for example, the integer frequency divider to the phase interpolation circuit 30. For example, in FIG. 16, since the frequency divider 83 divides the frequency into two, the 8×4=32-fraction phase division of the whole of the first to fourth quadrants corresponds to dividing the phase of 0 to 2π (360 degrees) into 16 by the configuration in FIGS. 18 and 19.

Further, in the configuration in FIGS. 18 and 19, since the phase of 0 to 2π can directly be divided into 16 phases without providing the multiphase clock signal generation circuit 82 and the multiplexer 86 shown in FIG. 16, the phase difference variation can also be reduced. For example, FIG. 14 described above is a simulation result of the phase difference variation when each quadrant is divided into eight by the configuration of FIG. 16, and FIG. 15 shows a simulation result of the phase difference variation when directly dividing each quadrant into sixteen with the configuration in FIGS. 18 and 19. According to the configuration of FIGS. 18 and 19, as shown in FIG. 15, the phase difference variation can be further reduced compared to FIG. 14, and the phase noise can further be reduced.

As described above, the phase interpolation circuit 30 according to the present embodiment generates the interpolation clock signal PICK obtained by performing the phase interpolation between the clock signal CK1 as the first clock signal and the clock signal CK2 as the second clock signal. Further, as shown in FIG. 1, the phase interpolation circuit 30 includes the current source circuit 40, the discharging transistor TD, the current control circuit 50, and the output circuit 60. The current source circuit 40 is disposed between the power supply node ND which is the first power supply node, and the node N1 which is the first node, and supplies the node N1 with the current I1 which is the first current flowing when the clock signal CK1 is activated and the current I2 which is the second current flowing when the clock signal CK2 is activated. The discharging transistor TD is disposed between the node N1 and the power supply node NG which is the second power supply node, and turns ON when the clock signal CK1 and the clock signal CK2 are inactivated. When taking FIGS. 4 and 5 as an example, when the clock signals CK1, CK2 become the high level which is the inactive level, the control signal SDS becomes the high level, whereby the discharging transistor TD is turned ON. The current control circuit 50 sets the current ratio between the current I1 and the current I2 based on the phase interpolation signal PI between the clock signal CK1 and of the clock signal CK2. For example, the current ratio between I1 and I2 is set by performing the operation described with reference to FIG. 6 and so on. Then, the output circuit 60 outputs the interpolation clock signal PICK based on the signal SQ at the node N1. For example, the interpolation clock signal PICK is output by the output circuit 60 having the configuration described with reference to FIG. 4 and so on.

As described above, according to the present embodiment, when the clock signal CK1 becomes active, the current I1 is supplied from the current source circuit 40 to the node N1, and when the clock signal CK2 becomes active, the current I2 is supplied from the current source circuit 40 to the node N1. Then, when the clock signal CK1 and the clock signal CK2 become inactive, the discharging transistor TD is turned ON, and the discharge at the node N1 is performed. Then, the current control circuit 50 sets the current ratio between the current I1 and the current I2 based on the phase interpolation signal PI. In this way, as described with reference to FIGS. 2 and 3, the phase interpolation of the clock signals CK1, CK2 can be performed at a phase division ratio corresponding to the current ratio between the currents I1, I2. Further, since it is not necessary to adopt a configuration in which the phase-dividing units are coupled in a pipeline manner as in the comparative example in FIG. 12, the linearity of the phases thus divided can be improved, and the variation between the samples can be reduced. In addition, complicated wiring as in the comparative example may not be performed, and the circuit can be reduced in size and power consumption.

Further, for example, it is assumed that the phase interpolation signal PI which generates an interpolation clock signal PICK having a phase closer to the phase of the signal corresponding to the clock signal CK1 than to the phase of the signal corresponding to the clock signal CK2 is input to the phase interpolation circuit 30. In this case, the current control circuit 50 sets a current ratio that makes the current I1 higher than the current I2. When the current ratio at which the current I1 becomes higher is set as described above, the phase of the interpolation clock signal PICK can be made closer to the phase of the signal corresponding to the clock signal CK1 as described with reference to FIG. 2, and it becomes possible to variably set the phase of the interpolation clock signal PICK by the setting of the current ratio between the currents I1, I2.

Further, for example, it is assumed that the phase interpolation signal PI which generates the interpolation clock signal PICK having a phase closer to the phase of the signal corresponding to the clock signal CK2 compared to the phase of the signal corresponding to the clock signal CK1 is input to the phase interpolation circuit 30. In this case, the current control circuit 50 sets the current ratio that makes the current I2 higher compared to the current I1. When the current ratio at which the current I2 becomes higher is set as described above, the phase of the interpolation clock signal PICK can be made closer to the phase of the signal corresponding to the clock signal CK2 as described with reference to FIG. 2, and it becomes possible to variably set the phase of the interpolation clock signal PICK by the setting of the current ratio between the currents I1, I2.

Further, as described with reference to FIG. 3, when the phase interpolation signal PI that performs the phase interpolation between the signal corresponding to the clock signal CK1 and the signal corresponding to the clock signal CK2 at the ratio of m:n is input, the current control circuit 50 sets the current ratio between the current I1 and the current I2 to n:m. In this way, by setting the current ratio between the currents I1, I2 to n:m, it becomes possible to generate the interpolation clock signal PICK obtained by performing the phase interpolation between the signal corresponding to the clock signal CK1 and the signal corresponding to the clock signal CK2 at m:n.

Further, as shown in FIG. 4, the output circuit 60 includes the capacitor CP one end of which is coupled to the node N1 and the buffer circuit IV to which the signal of the node N1 is input. When the capacitor CP and the buffer circuit IV described above are provided to the output circuit 60, it becomes possible to charge the capacitance of the capacitor CP at the node N1 by the current I1 flowing when the clock signal CK1 becomes active or the current I2 flowing when the clock signal CK2 becomes active. Then, it becomes possible to input the signal SQ at the node N1 to the buffer circuit IV to thereby generate the interpolation clock signal PICK.

Further, as shown in FIG. 4, the current source circuit 40 includes the plurality of current source transistors TS0 to TS3 disposed in parallel to each other between the power supply node ND and the node N1. Then, as shown in FIGS. 5 and 6, the current control circuit 50 outputs, to the gates of the current source transistors of the plurality of current source transistors TS0 to TS3, the respective selection clock signals of the plurality of selection clock signals SCK0 to SCK3 selected based on the phase interpolation signal PI from the clock signal CK1 or the clock signal CK2. This makes it possible to select the clock signal CK1 or the clock signal CK2 as the selection clock signals SCK0, SCK1, SCK2, and SCK3 based on the phase interpolation signal PI and then input the selection clock signals SCK0, SCK1, SCK2, and SCK3 to the gates of the current source transistors TS0, TS1, TS2, and TS3, respectively. Then, when the clock signal CK1 is activated, the current source transistor to which the clock signal CK1 is input as the selection clock signal turns ON to supply the current I1 to the node N1. Further, when the clock signal CK2 is activated, the current source transistor to which the clock signal CK2 is input as the selection clock signal turns ON to supply the current I2 to the node N1. Thus, it becomes possible to supply the currents I1, I2 to the node N1 at a current ratio corresponding to the phase interpolation signal PI.

Further, as shown in FIG. 5, the current control circuit 50 includes the plurality of selectors SL0 to SL3, and each of the selectors SL0 to SL3 outputs each of the selection clock signals SCK0 to SCK3 to the gates of the current source transistors TS0 to TS3. In this way, it becomes possible to select the clock signal CK1 or the clock signal CK2 as the selection clock signal based on the phase interpolation signal PI using the selectors SL0 to SL3, and to input the selection clock signals SCK0 to SCK3 to the gates of the respective current source transistors TS0 to TS3.

Further, as shown in FIGS. 4 and 8, each of the current source transistors TS0 to TS3 includes one unit transistor or a plurality of unit transistors. For example, when the current source transistor is configured with the first unit transistor and the second unit transistor, the gate width and the gate length of the first unit transistor and the gate width and the gate length of the second unit transistor are made the same as each other, respectively. By configuring each current source transistor with the unit transistors in this way, it becomes possible to set the current ratio between the plurality of current source transistors by the number of unit transistors. Thus, it becomes possible to set the current ratio between the currents I1, I2 using the setting of the number of unit transistors to set the division ratio of the phase interpolation. Further, by configuring each current source transistor with the unit transistors, it becomes possible to more accurately realize the setting of the current ratio by the current source transistors, and thus, the harmful influence of the manufacturing variation and so on can be reduced.

Further, the current source circuit 40 includes a first current source transistor having the gate to which a first selection clock signal selected based on the phase interpolation signal PI from the clock signal CK1 or the clock signal CK2 is input, and a second current source transistor having the gate to which a second selection clock signal selected based on the phase interpolation signal PI from the clock signal CK1 or the clock signal CK2 is input. For example, in FIG. 4, the first current source transistor is one of the current source transistors TS0 to TS3, and the second current source transistor is another one of the current source transistors TS0 to TS3. Further, the first selection clock signal is one of the selection clock signals SCK0 to SCK3, and the second selection clock signal is another one of the selection clock signals SCK 0 to SCK3. In this way, it becomes possible to supply the node N1 with the current from the first current source transistor having the gate to which the first selection clock signal is input and the current from the second current source transistor having the gate to which the second selection clock signal is input. Then, when the clock signal CK1 is selected as the first selection clock signal, it becomes possible to supply the current I1 from the first current source transistor to the node N1 when the clock signal CK1 is active. Further, when the clock signal CK2 is selected as the first selection clock signal, it becomes possible to supply the current I2 from the first current source transistor to the node N1 when the clock signal CK2 is active. Similarly, when the clock signal CK1 is selected as the second selection clock signal, it becomes possible to supply the current I1 from the second current source transistor to the node N1 when the clock signal CK1 is active. Further, when the clock signal CK2 is selected as the second selection clock signal, it becomes possible to supply the current I2 from the second current source transistor to the node N1 when the clock signal CK2 is active.

Further, the current source circuit 40 includes a first dummy transistor which is disposed in parallel to the first current source transistor and has a gate to which the first selection clock signal is input and a drain which is not coupled to the node N1, and a second dummy transistor which is disposed in parallel to the second current source transistor and has a gate to which the second selection clock signal is input and a drain which is not coupled to the node N1. For example, in FIG. 4, the first dummy transistor is one of the dummy transistors DM0 to DM3, and the second dummy transistor is another one of the dummy transistors DM0 to DM3.

Further, as shown in FIG. 8, the sum of the gate area of the first current source transistor and the gate area of the first dummy transistor is equal to the sum of the gate area of the second current source transistor and the gate area of the second dummy transistor. Here, the expression that the sum of the gate areas is equal only requires that the sum of the gate areas is substantively equal, and includes when the sum of the gate areas is substantially equal. Further, the gate area is defined by, for example, the gate width W and the gate length L of the transistor, and corresponds to, for example, W×L. For example, in FIG. 8, the sum of the gate area of the current source transistor TS0 and the gate area of the dummy transistor DM0 is equal to the sum of the gate area of the current source transistor TS2 and the gate area of the dummy transistor DM2. Further, the sum of the gate area of the current source transistor TS1 and the gate area of the dummy transistor DM1 is equal to the sum of the gate area of the current source transistor TS2 and the gate area of the dummy transistor DM2. In this way, the gate capacitances of the transistors added to the selection clock signals SCK0, SCK1, SCK2, and SCK3 can be made equal to each other, and rounding of the waveform of the selection clock signal caused by the gate capacitance can be made equivalent. This makes it possible to improve the linearity of the phase interpolation of the interpolation clock signal PICK.

Further, as shown in FIG. 9, the circuit device 20 according to the present embodiment includes the phase interpolation circuit 30, and includes a frequency divider circuit 80 that outputs an interpolation clock signal PICK, which is output from the phase interpolation circuit 30, as the feedback clock signal FBCK, and the phase comparison circuit 72 that performs the phase comparison between the reference clock signal RFCK and the feedback clock signal FBCK. Further, the circuit device 20 includes the control voltage generation circuit 73 that generates the control voltage VC based on the phase comparison result of the phase comparison circuit 72, and the voltage-controlled oscillation circuit 76 that generates the clock signal CK having a frequency corresponding to the control voltage VC. Further, the phase interpolation circuit 30 generates the interpolation clock signal PICK from the clock signal CK1 and the clock signal CK2 based on the clock signal CK. In this way, in the PLL circuit including the phase comparison circuit 72, the control voltage generation circuit 73, the voltage-controlled oscillation circuit 76, and the frequency divider circuit 80, the interpolation clock signal PICK generated by the phase interpolation circuit 30 can be input to the phase comparison circuit 72 as the feedback clock signal FBCK. As a result, for example, it is possible to make the resolution of the fractional frequency dividing of the frequency divider circuit 80 finer. Accordingly, the phase fluctuation range can be reduced, and the phase noise of the clock signal CK can be reduced.

3. Oscillator

Figure 21:
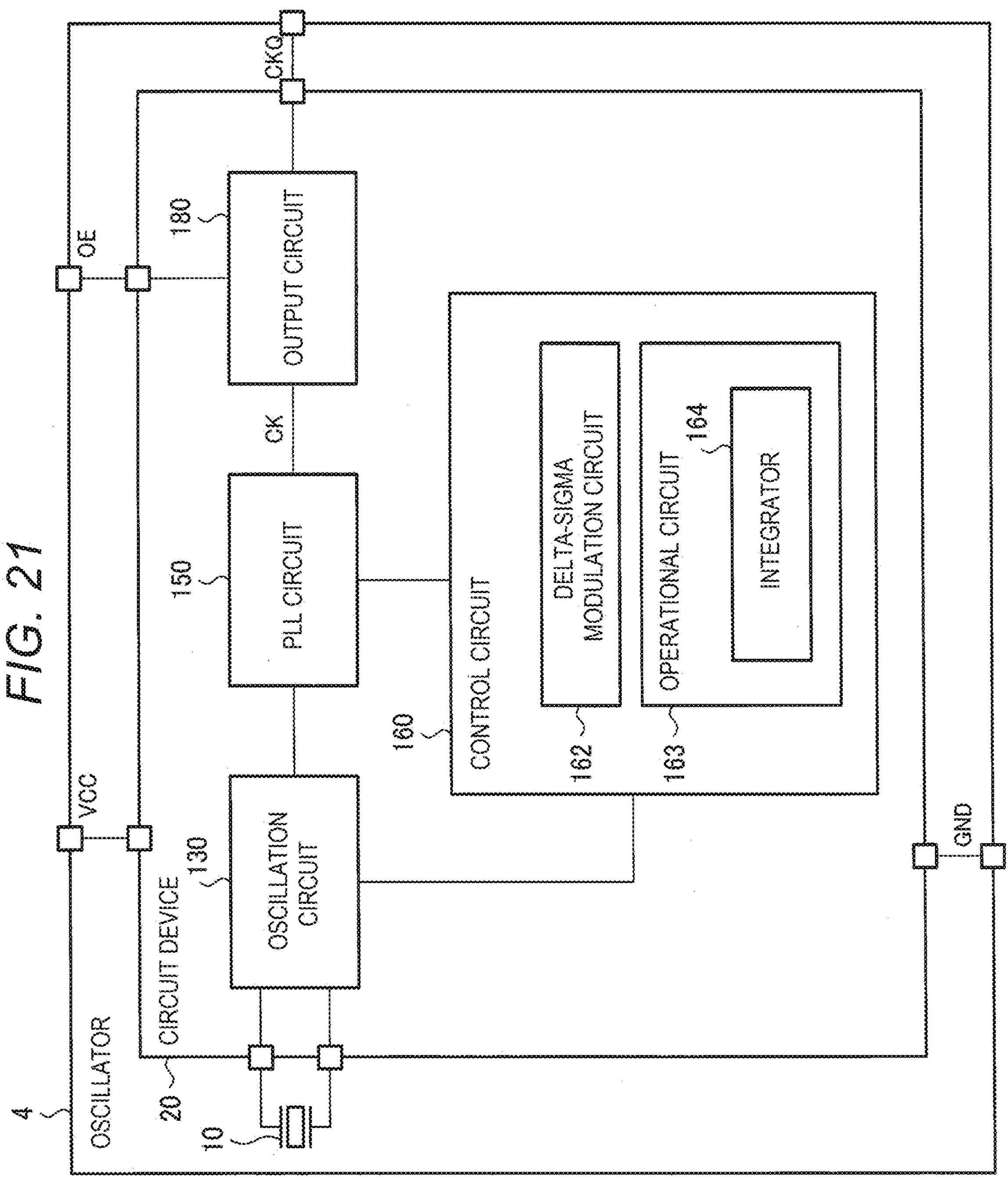
FIG. 21 is a diagram showing a configuration example of an oscillator according to the present embodiment.

FIG. 21 shows a configuration example of an oscillator 4 according to the embodiment. The oscillator 4 according to the present embodiment includes the circuit device 20 according to the present embodiment and a resonator 10 for generating the reference clock signal RFCK. For example, in FIG. 21, the resonator 10 is electrically coupled to the circuit device 20. For example, the resonator 10 and the circuit device 20 are electrically coupled using internal wiring, bonding wires, or metal bumps of a package that houses the resonator 10 and the circuit device 20.

The resonator 10 is an element that generates mechanical vibration by an electric signal. The resonator 10 can be implemented by a resonator element such as a quartz crystal resonator element. For example, the resonator 10 can be implemented by a quartz crystal resonator element which a cutting angle such as AT-cut or SC-cut, and which makes a thickness-shear vibration, a tuning-fork type quartz crystal resonator element, a double tuning-fork type quartz crystal resonator element, or the like. For example, the resonator 10 may be a resonator incorporated in a simple packaged crystal oscillator (SPXO), or may be a resonator incorporated in a temperature-compensated crystal oscillator (TCXO) without a thermostatic oven, or a resonator incorporated in an oven-controlled quartz crystal oscillator (OCXO) with a thermostatic oven. Note that the resonator 10 according to the present embodiment can also be implemented by various resonator elements such as a resonator element other than the thickness-shear vibrating type, the tuning-fork type, or the double tuning-fork type resonator element, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit device 20 in FIG. 21 includes an oscillation circuit 130, a PLL circuit 150, a control circuit 160, and an output circuit 180.

The oscillation circuit 130 is a circuit that oscillates the resonator 10. For example, the oscillation circuit 130 generates the oscillation signal by oscillating the resonator 10. For example, the oscillation circuit 130 can be implemented by a drive circuit for oscillation electrically coupled to one end and the other end of the resonator 10 and passive elements such as a capacitor and a resistor. The drive circuit can be implemented by, for example, a CMOS inverter circuit or a bipolar transistor. The drive circuit is a core circuit of the oscillation circuit 130, and the drive circuit performs voltage drive or current drive on the resonator 10 to oscillate the resonator 10. As the oscillation circuit 130, oscillation circuits of various types such as an inverter type, a Pierce type, a Colpitts type, or a Hartley type can be used. Note that the coupling in the present embodiment is electrical coupling. The electrical coupling means coupling in which an electrical signal can be transmitted, and is coupling in which information can be transmitted with an electrical signal. The electrical coupling may be coupling through a passive element and the like.

The PLL circuit 150 is a PLL circuit realized by a circuit such as the phase interpolation circuit 30 in the present embodiment. A clock signal based on the oscillation signal obtained by oscillating the resonator 10 with the oscillation circuit 130 is input to the PLL circuit 150 as the reference clock signal RFCK. Further, the PLL circuit 150 performs phase comparison between the reference clock signal RFCK based on the oscillation signal of the resonator 10 and the feedback clock signal FBCK to generate a clock signal CK with a charge pump operation or the like. Note that the PLL circuit 150 may perform a synchronization operation with an FLL operation when the phase difference between the reference clock signal RFCK and the feedback clock signal FBCK is not in the dead zone, or may perform a synchronization operation with an SPLL operation when the phase difference comes into the dead zone.

The control circuit 160 is a logic circuit and performs various types of control processing and arithmetic processing. For example, the control circuit 160 performs overall control of the circuit device 20 and performs control of the operation sequence of the circuit device 20. Further, the control circuit 160 performs various kinds of processing for controlling the oscillation circuit 130. The control circuit 160 can be implemented by a circuit of an application specific integrated circuit (ASIC) with automatic placement and wiring such as a gate array.

Further, the control circuit 160 includes a delta-sigma modulation circuit 162 and an operational circuit 163, and the operational circuit 163 includes an integrator 164. The delta-sigma modulation circuit 162, the operational circuit 163, and the integrator 164 correspond to the delta-sigma modulation circuit 90, the operational circuit 92, and the integrator 94 in FIG. 9, respectively.

The output circuit 180 buffers the clock signal CK from the PLL circuit 150 to output an output clock signal CKQ. The output clock signal CKQ becomes an external output clock signal of the oscillator 4. Further, an output enable signal OE from the outside is input to the output circuit 180, and the output circuit 180 outputs the output clock signal CKQ when the output enable signal OE is active. Thus, the output clock signal CKQ becomes to be output to the outside of the oscillator 4. On the other hand, when the output enable signal OE is inactive, the output terminal of the output clock signal CKQ is set to a fixed voltage such as the low level.

Note that in FIG. 21, a temperature compensation circuit is not provided, and in this case, the SPXO oscillator is used as the oscillator 4. Specifically, the oscillator 4 is a programmable SPXO capable of outputting the output clock signal CKQ with any frequency in accordance with the division ratio setting code set to the PLL circuit 150. However, the configuration of the TCXO oscillator 4 may be adopted by providing a temperature compensation circuit that performs temperature compensation processing based on the temperature detection result of the temperature sensor in the configuration of FIG. 21. In this case, a variable capacitance circuit the capacitance of which is controlled by the temperature compensation voltage from the temperature compensation circuit is sufficiently provided to the oscillation circuit 130.

As described hereinabove, a phase interpolation circuit of the present embodiment generates an interpolation clock signal obtained by performing phase interpolation between a first clock signal and a second clock signal different in phase from the first clock signal. Further, the phase interpolation circuit includes a current source circuit which is disposed between a first power supply node and a first node, and supplies the first node with a first current flowing when the first clock signal becomes active and a second current flowing when the second clock signal becomes active, and a discharging transistor which is disposed between the first node and a second power supply node, and turns ON when the first clock signal and the second clock signal become inactive. Further, the phase interpolation circuit includes a current control circuit that sets a current ratio between the first current and the second current based on a phase interpolation signal that instructs a ratio of phase interpolation between the first clock signal and the second clock signal, and an output circuit that outputs an interpolation clock signal based on a signal at the first node.

According to the present embodiment, when the first clock signal becomes active, the first current is supplied from the current source circuit to the first node, and when the second clock signal becomes active, the second current is supplied from the current source circuit to the first node. Further, when the first clock signal and the second clock signal become inactive, the discharging transistor is turned ON, and discharge at the first node is performed. The current control circuit sets a current ratio between the first current and the second current based on the phase interpolation signal. In this way, it becomes possible to perform the phase interpolation between the first clock signal and the second clock signal at a phase division ratio corresponding to the current ratio between the first current and the second current. This makes it possible to improve the linearity of the divisional phases in the interpolation clock signal, and to realize the reduction in scale, the reduction in power consumption, and so on.

Further, in the present embodiment, the current control circuit may set the current ratio that makes the first current higher compared to the second current when the phase interpolation signal that generates the interpolation clock signal having a phase closer to a phase of a signal corresponding to the first clock signal than to a phase of a signal corresponding to the second clock signal is input.

By setting the current ratio at which the first current becomes higher, it becomes possible to make the phase of the interpolation clock signal closer to the phase of the signal corresponding to the first clock signal, and to set the phase of the interpolation clock signal based on the setting of the current ratio.

Further, in the present embodiment, the current control circuit may set the current ratio that makes the second current higher compared to the first current when the phase interpolation signal which generates the interpolation clock signal having a phase closer to the phase of the signal corresponding to the second clock signal than to the phase of the signal corresponding to the first clock signal is input.

By setting the current ratio at which the second current becomes higher, it becomes possible to make the phase of the interpolation clock signal closer to the phase of the signal corresponding to the second clock signal, and to set the phase of the interpolation clock signal based on the setting of the current ratio.

Further, in the present embodiment, the current control circuit may set the current ratio between the first current and the second current to n:m when the phase interpolation signal which performs the phase interpolation between the signal corresponding to the first clock signal and the signal corresponding to the second clock signal at a ratio of m:n is input.

By setting the current ratio between the first current and the second current to n:m in this way, it becomes possible to generate the interpolation clock signal obtained by performing the phase interpolation between the signal corresponding to the first clock signal and the signal corresponding to the second clock signal at m:n.

Further, in the present embodiment, the output circuit may include a capacitor one end of which is coupled to the first node, and a buffer circuit to which the signal at the first node is input.

In this way, it becomes possible to generate the interpolation clock signal by charging the capacitor at the first node with the first current or the second current to input the signal at the first node to the buffer circuit.

Further, in the present embodiment, the current source circuit may include a plurality of current source transistors disposed in parallel between the first power supply node and the first node, and the current control circuit may output selection clock signals each selected based on the phase interpolation signal from the first clock signal or the second clock signal to gates of the current source transistors, respectively.

In this way, it become possible to select the first clock signal or the second clock signal as the selection clock signal based on the phase interpolation signal, input the selection clock signal to the gate of the current source transistor, and supply the first node with the first current when the first clock signal becomes active and the second current when the second clock signal becomes active.

Further, in the present embodiment, the current control circuit may include a plurality of selectors, and the plurality of selectors may output the selection clock signals to the gates of the current source transistors, respectively.

In this way, it becomes possible to select the first clock signal or the second clock signal as the selection clock signals, and input the selection clock signals to the gates of the current source transistors using the selectors, respectively.

Further, in the present embodiment, each of the current source transistors may include one unit transistor or a plurality of unit transistors.

In this way, it becomes possible to set the current ratio between the plurality of current source transistors with the number of unit transistors.

Further, in the present embodiment, the current source circuit may include a first current source transistor having a gate to which a first selection clock signal selected based on the phase interpolation signal from the first clock signal or the second clock signal is input, and a second current source transistor having a gate to which a second selection clock signal selected based on the phase interpolation signal from the first clock signal or the second clock signal is input.

In this way, it becomes possible to supply the first node with a current from the first current source transistor having the gate to which the first selection clock signal is input, and a current from the second current source transistor having the gate to which the second selection clock signal is input.

Further, in the present embodiment, the current source circuit may include a first dummy transistor which is disposed in parallel to the first current source transistor, which has a gate to which the first selection clock signal is input, and a drain of which is not coupled to the first node, and a second dummy transistor which is disposed in parallel to the second current source transistor, which has a gate to which the second selection clock signal is input, and a drain of which is not coupled to the first node. Further, a sum of a gate area of the first current source transistor and a gate area of the first dummy transistor may be equal to a sum of a gate area of the second current source transistor and a gate area of the second dummy transistor.

In this way, the gate capacitances of the transistors added to the first selection clock signal and the second selection clock signal can be made equivalent to each other, the first selection clock signal and the second selection clock signal can made equivalent to each other in rounding of the waveform caused by the gate capacitance, and it becomes possible to improve the linearity of the phase interpolation of the interpolation clock signal.

Further, a circuit device according to the present embodiment includes the phase interpolation circuit described above, and includes a frequency divider circuit configured to output the interpolation clock signal from the phase interpolation circuit as a feedback clock signal, a phase comparison circuit configured to perform phase comparison between a reference clock signal and the feedback clock signal, a control voltage generation circuit configured to generate a control voltage based on a phase comparison result of the phase comparison circuit, and a voltage-controlled oscillation circuit configured to generate a clock signal with a frequency corresponding to the control voltage. Further, the phase interpolation circuit generates the interpolation clock signal from the first clock signal and the second clock signal based on the clock signal.

In this way, in the PLL circuit including the phase comparison circuit, the control voltage generation circuit, the voltage-controlled oscillation circuit, and the frequency divider circuit, it becomes possible to input the interpolation clock signal generated by the phase interpolation circuit to the phase comparison circuit as the feedback clock signal.

Further, an oscillator according to the present embodiment includes the circuit device described above and a resonator configured to generate the reference clock signal.

Note that the present embodiment has been described above in detail, and a person skilled in the art may readily understand that many modifications can be made to the present embodiment without substantially departing from the novel matters and advantages of the present disclosure. Such modifications are all therefore assumed to fall within the scope of the present disclosure. For example, a term described at least once in the specification or the drawings along with a different term having a broader meaning or the same meaning can be replaced with the different term anywhere in the specification or the drawings. Furthermore, any combination of the present embodiment and the modifications fall within the scope of the present disclosure. Further, the configurations, operations, and the like of the phase interpolation circuit, the circuit device, and the oscillator are not limited to those described in the embodiment, but various modified implementations can be made.

What is claimed is:

1. A phase interpolation circuit configured to generate an interpolation clock signal obtained by performing phase interpolation between a first clock signal and a second clock signal different in phase from the first clock signal, the phase interpolation circuit comprising:

- a current source circuit that is disposed between a first power supply node and a first node, and supplies the first node with a first current that flows when the first clock signal becomes active and a second current that flows when the second clock signal becomes active;
- a discharging transistor that is disposed between the first node and a second power supply node, and that is turned ON when the first clock signal and the second clock signal become inactive;
- a current control circuit configured to set a current ratio between the first current and the second current based on a phase interpolation signal that instructs a ratio of phase interpolation between the first clock signal and the second clock signal; and
- an output circuit configured to output the interpolation clock signal based on a signal at the first node.

2. The phase interpolation circuit according to claim 1, wherein

- the current control circuit is configured to set the current ratio that makes the first current higher compared to the second current when the phase interpolation signal that generates the interpolation clock signal having a phase closer to a phase of a signal corresponding to the first clock signal than to a phase of a signal corresponding to the second clock signal is input.

3. The phase interpolation circuit according to claim 1, wherein

- the current control circuit is configured to set the current ratio that makes the second current higher compared to the first current when the phase interpolation signal that generates the interpolation clock signal having a phase closer to a phase of a signal corresponding to the second clock signal than to a phase of a signal corresponding to the first clock signal is input.

4. The phase interpolation circuit according to claim 1, wherein

- the current control circuit is configured to set the current ratio between the first current and the second current to n:m when the phase interpolation signal that performs phase interpolation between a signal corresponding to the first clock signal and a signal corresponding to the second clock signal at a ratio of m:n is input.

5. The phase interpolation circuit according to claim 1, wherein the output circuit includes a capacitor one end of which is coupled to the first node, and a buffer circuit to which a signal at the first node is input.

6. The phase interpolation circuit according to claim 1, wherein the current source circuit includes a plurality of current source transistors disposed in parallel between the first power supply node and the first node, and the current control circuit outputs selection clock signals each selected based on the phase interpolation signal from the first clock signal or the second clock signal to gates of the current source transistors, respectively.

7. The phase interpolation circuit according to claim 6, wherein the current control circuit includes a plurality of selectors, and the plurality of selectors outputs the selection clock signals to the gates of the current source transistors, respectively.

8. The phase interpolation circuit according to claim 6, wherein each of the current source transistors includes one unit transistor or a plurality of unit transistors.

9. The phase interpolation circuit according to claim 1, wherein the current source circuit includes a first current source transistor having a gate to which a first selection clock signal selected based on the phase interpolation signal from the first clock signal or the second clock signal is input, and a second current source transistor having a gate to which a second selection clock signal selected based on the phase interpolation signal from the first clock signal or the second clock signal is input.

10. The phase interpolation circuit according to claim 9, wherein the current source circuit includes a first dummy transistor which is disposed in parallel to the first current source transistor, which has a gate to which the first selection clock signal is input, and a drain of which is not coupled to the first node, and a second dummy transistor which is disposed in parallel to the second current source transistor, which has a gate to which the second selection clock signal is input, and a drain of which is not coupled to the first node, and a sum of a gate area of the first current source transistor and a gate area of the first dummy transistor is equal to a sum of a gate area of the second current source transistor and a gate area of the second dummy transistor.

11. A circuit device comprising:

the phase interpolation circuit according to claim 1;

a frequency divider circuit configured to output the interpolation clock signal from the phase interpolation circuit as a feedback clock signal;

a phase comparison circuit configured to perform phase comparison between a reference clock signal and the feedback clock signal;

a control voltage generation circuit configured to generate a control voltage based on a phase comparison result of the phase comparison circuit; and a voltage-controlled oscillation circuit configured to generate a clock signal with a frequency corresponding to the control voltage, wherein the phase interpolation circuit generates the interpolation clock signal from the first clock signal and the second clock signal based on the clock signal.

12. An oscillator comprising:

the circuit device according to claim 11; and a resonator configured to generate the reference clock signal.

* * * * *